(12) United States Patent
Fujiwara

(10) Patent No.: US 8,018,571 B2
(45) Date of Patent: Sep. 13, 2011

(54) EXPOSURE APPARATUS AND EXPOSURE METHOD, AND DEVICE MANUFACTURING METHOD

(75) Inventor: Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 605 days.

(21) Appl. No.: 12/034,352

(22) Filed: Feb. 20, 2008

(65) Prior Publication Data

US 2008/0226332 A1   Sep. 18, 2008

Related U.S. Application Data

(63) Continuation of application No. PCT/JP2006/316417, filed on Aug. 22, 2006.

(30) Foreign Application Priority Data

Aug. 23, 2005 (JP) ............................... P2005-241054
Dec. 26, 2005 (JP) ............................... P2005-371591

(51) Int. Cl.
G03B 27/52 (2006.01)
G03B 27/42 (2006.01)

(52) U.S. Cl. ......................................... 355/30; 355/53

(58) Field of Classification Search ................... 355/30, 355/53, 72, 77; 430/311
See application file for complete search history.

(56) References Cited

U.S. PATENT DOCUMENTS

| 5,271,980 | A | * | 12/1993 | Bell ................................. 428/68 |
| 5,610,683 | A | | 3/1997 | Takahashi |
| 5,825,043 | A | | 10/1998 | Suwa |
| 5,874,664 | A | * | 2/1999 | Watanabe et al. ............. 73/23.32 |
| 5,969,441 | A | | 10/1999 | Loopstra et al. |
| 6,208,407 | B1 | | 3/2001 | Loopstra |
| 6,590,634 | B1 | | 7/2003 | Nishi et al. |
| 6,611,316 | B2 | | 8/2003 | Sewell |
| 6,721,034 | B1 | | 4/2004 | Horikawa |
| 6,778,257 | B2 | | 8/2004 | Bleeker et al. |
| 6,897,963 | B1 | | 5/2005 | Taniguchi et al. |
| 6,952,253 | B2 | | 10/2005 | Lof et al. |
| 2005/0078286 | A1 | | 4/2005 | Dierichs et al. |
| 2005/0178535 | A1 | | 8/2005 | Ricci et al. |
| 2005/0280791 | A1 | | 12/2005 | Nagasaka et al. |
| 2006/0119818 | A1 | | 6/2006 | Nagasaka |
| 2006/0187433 | A1 | | 8/2006 | Nagahashi |
| 2007/0242241 | A1 | | 10/2007 | Nagasaka et al. |

FOREIGN PATENT DOCUMENTS

EP    0 605 103 A1    7/1994

(Continued)

OTHER PUBLICATIONS

Written Opinion Issued on the counterpart PCT Patent Application No. PCT/JP2006/316417 on Nov. 7, 2006.

*Primary Examiner* — Peter B Kim
(74) *Attorney, Agent, or Firm* — Miles & Stockbridge P.C.

(57) ABSTRACT

An exposure apparatus includes: a supply port through which a liquid is supplied to an optical path space of exposure light; and a supply passage in which the liquid flows and which is in fluid communication with the supply port. An amount of a predetermined substance mixed into the liquid in the supply passage is set to be not greater than a predetermined value.

43 Claims, 12 Drawing Sheets

FOREIGN PATENT DOCUMENTS

| | | |
|---|---|---|
| EP | 1 420 298 A2 | 5/2004 |
| EP | 1 524 558 A1 | 4/2005 |
| EP | 1 598 855 A1 | 11/2005 |
| JP | 06-124873 A | 5/1994 |
| JP | 6-168866 A | 6/1994 |
| JP | 06-168866 A | 6/1994 |
| JP | 08-130179 A | 5/1996 |
| JP | 10-163099 A | 6/1998 |
| JP | 10-214783 A | 8/1998 |
| JP | 10-303114 A | 11/1998 |
| JP | 11-135400 A | 5/1999 |
| JP | 2000-505958 | 5/2000 |
| JP | 2000-164504 A | 6/2000 |
| JP | 2001-510577 A | 7/2001 |
| JP | 2004-519850 A | 7/2004 |
| JP | 2004-289126 A | 10/2004 |
| JP | 2005-45232 A | 2/2005 |
| JP | 2005-109426 A | 4/2005 |
| JP | 2005-209705 A | 8/2005 |
| JP | 2006-73906 A | 3/2006 |
| WO | WO 99/23692 A1 | 5/1999 |
| WO | WO 99/28790 A1 | 6/1999 |
| WO | WO 99/49504 A1 | 9/1999 |
| WO | WO 01/35168 A1 | 5/2001 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2005/029559 A1 | 3/2005 |
| WO | WO 2005/038888 A1 | 4/2005 |
| WO | WO 2005/071717 A1 | 8/2005 |

* cited by examiner

US 8,018,571 B2

EXPOSURE APPARATUS AND EXPOSURE METHOD, AND DEVICE MANUFACTURING METHOD

CROSS-REFERENCE TO RELATED APPLICATION

This is a Continuation Application of International Application No. PCT/JP2006/316417, filed Aug. 22, 2006, which claims priority to Japanese Patent Application Nos. 2005-241054, filed Aug. 23, 2005, and 2005-371591, filed Dec. 26, 2005. The contents of the aforementioned applications are incorporated herein by reference.

BACKGROUND

1. Field of the Invention

The present invention relates to an exposure apparatus and exposure method for exposing a substrate, and to a device manufacturing method.

2. Description of Related Art

As an exposure apparatus for use in the photolithography process, there is proposed an immersion exposure apparatus as disclosed in PCT International Patent Publication No. WO 99/49504, in which a liquid is filled in an optical path space of the exposure light and a substrate is exposed via the liquid.

If impurities are mixed in the liquid that is filled in the optical path space of the exposure light, there is a possibility that defective exposure occurs such as faults in the pattern formed on the substrate.

A purpose of some aspects of the present invention is to provide an exposure apparatus and exposure method that can suppress the occurrence of defective exposure. Another purpose is to provide a device manufacturing method using the exposure apparatus and the exposure method.

SUMMARY

According to a first aspect of the present invention, there is provided an exposure apparatus that exposes a substrate, including: a supply port through which a liquid is supplied to an optical path space of exposure light; and a supply passage in which the liquid flows and which is in fluid communication with the supply port, in which an amount of a predetermined substance mixed into the liquid in the supply passage is set to be not greater than a predetermined value.

According to the first aspect of the present invention, an amount of the predetermined substance in the liquid to be supplied to the optical path of the exposure light can be suppressed, and thereby the occurrence of defective exposure can be suppressed.

According to a second aspect of the present invention, there is provided an exposure apparatus that exposes a substrate, including: a supply port through which a liquid is supplied to an optical path space of exposure light; a supply passage in which the liquid flows and which is in fluid communication with the supply port; a first member through which a first gas is capable of passing and which forms the supply passage; and a prevention apparatus for preventing deterioration of the liquid by the first gas that has passed through the first member.

According to the second aspect of the present invention, deterioration by the gas of the liquid to be supplied to the optical path of the exposure light can be prevented, and thereby the occurrence of defective exposure can be suppressed.

According to a third aspect of the present invention, there is provided a device manufacturing method using the exposure apparatus of one of the above aspects.

According to the third aspect of the present invention, devices can be manufactured using the exposure apparatus that is capable of suppressing the occurrence of defective exposure.

According to a fourth aspect of the present invention, there is provided an exposure method that exposes a substrate, including: flowing a liquid in a supply passage; and supplying the liquid to an optical path space of exposure light from a supply port via the supply passage, in which an amount of a predetermined substance mixed into the liquid in the supply passage is set to be not greater than a predetermined value.

According to the fourth aspect of the present invention, an amount of the predetermined substance in the liquid to be supplied to the optical path of the exposure light can be suppressed, and thereby the occurrence of defective exposure can be suppressed.

According to a fifth aspect of the present invention, there is provided a device manufacturing method using the exposure method of the above aspect.

According to the fifth aspect of the present invention, devices can be manufactured using the exposure method that is capable of suppressing the occurrence of defective exposure.

According to a sixth aspect of the present invention, there is provided an immersion formation apparatus, used in an immersion exposure apparatus that exposes a substrate, for forming an immersion space through which exposure light passes, including: a supply port through which a liquid is supplied to an optical path space of the exposure light; and a supply passage which is connected to the supply port, in which the optical path space is filled with the liquid via the supply passage and the supply port to form the immersion space, and mixing of a predetermined substance into the liquid in the supply passage is suppressed.

According to the sixth aspect of the present invention, the flow of the predetermined substance into the immersion space can be suppressed (prevented), and thereby the occurrence of defective exposure in the immersion exposure apparatus can be suppressed.

DESCRIPTION OF THE PREFERRED EMBODIMENTS

Hereunder is a description of embodiments of the present invention with reference to the drawings. However, the present invention is not limited to this description. In the following description, an XYZ rectangular co-ordinate system is established, and the positional relationship of respective members is described with reference to this XYZ rectangular co-ordinate system. A predetermined direction within a horizontal plane is made the X axis direction, a direction orthogonal to the X axis direction in the horizontal plane is made the Y axis direction, and a direction orthogonal to both the X axis direction and the Y axis direction (that is, a perpendicular direction) is made the Z axis direction. Furthermore, rotation (inclination) directions about the X axis, the Y axis and the Z axis, are made the θX, the θY, and the θZ directions, respectively.

First Embodiment

Figure 1:
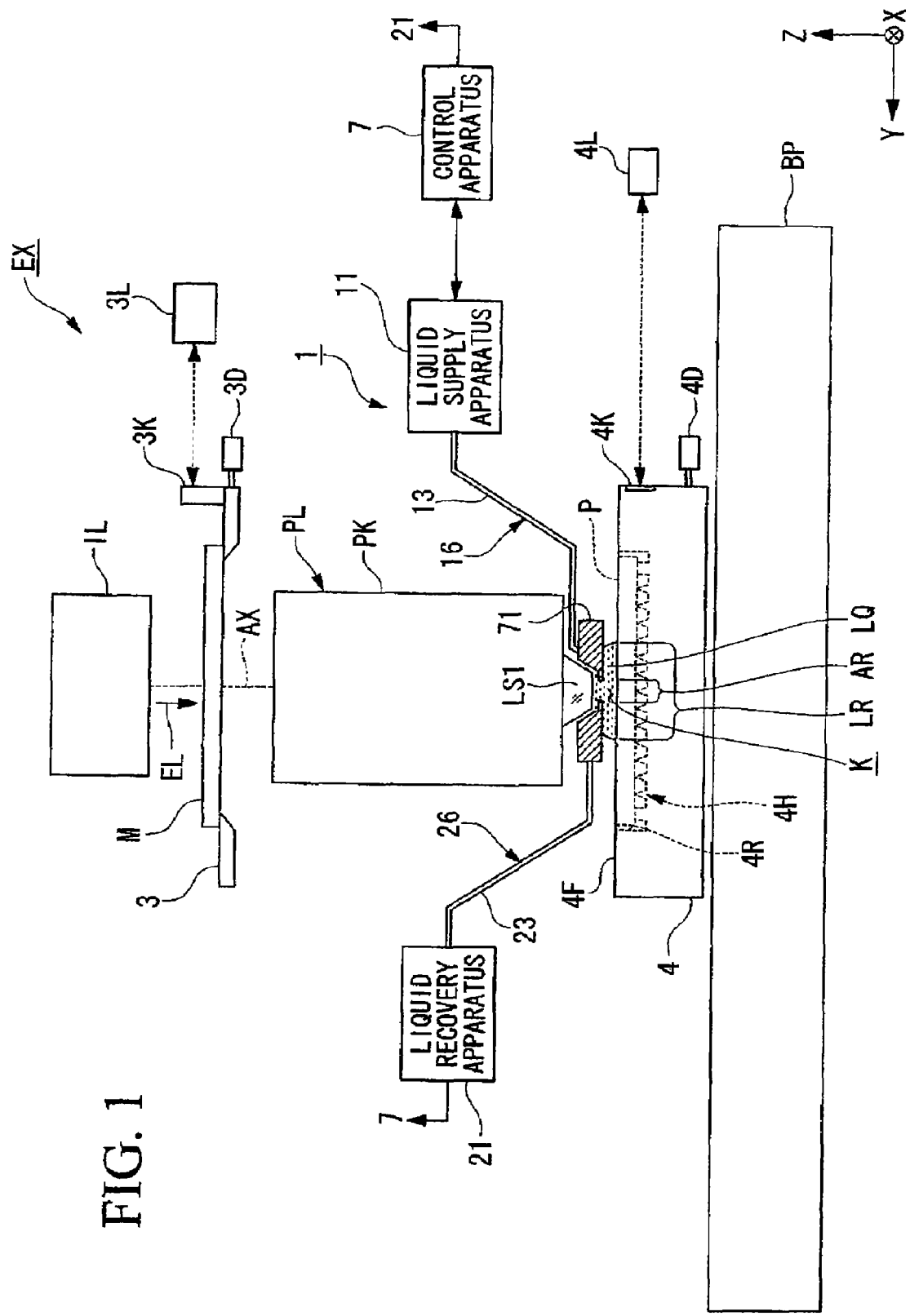
FIG. 1 is a schematic block diagram showing an exposure apparatus according to a first embodiment.

A first embodiment will be explained. FIG. 1 is a schematic block diagram showing an exposure apparatus EX according to the first embodiment. In FIG. 1, the exposure apparatus EX includes: a mask stage 3 capable of holding and moving a mask M; a substrate stage 4 that has a substrate holder 4H for holding a substrate P and that is capable of holding and moving the substrate P held in the substrate holder 4H; an illumination optical system IL for illuminating the mask M held on the mask stage 3 with exposure light EL; a projection optical system PL for projecting a pattern image of the mask M illuminated by the exposure light EL onto the substrate P; and a control apparatus 7 for controlling the operation of the entire exposure apparatus EX. The substrate here includes one in which a film of a sensitive material (photoresist), a protection film (top coat film) and/or an anti-reflection film is spread on a base material such as a semiconductor wafer or the like. The mask includes a reticle formed with a device pattern which is reduction-size projected onto the substrate. In the present embodiment, a transmission mask is used as the mask. However, a reflecting mask may be used.

The exposure apparatus EX of the present embodiment is an immersion exposure apparatus to which an immersion method is applied for substantially shortening the exposure length and improving the resolution, and also substantially expanding the depth of focus. The exposure apparatus EX includes an immersion system 1 which fills an optical path (optical path space) K of exposure light EL in the vicinity of an image plane of a projection optical system PL with a liquid LQ. Operation of the immersion system 1 is controlled by a control apparatus 7. The immersion system 1 fills with the liquid LQ the optical path space K of the exposure light EL between a bottom surface of a first optical element LS1 which is closest to the image plane of the projection optical system PL among a plurality of optical elements and a surface of the substrate P in the substrate holder 4H arranged on the image plane side of the projection optical system, to thereby form an immersion region LR. In the present embodiment, water (pure water) is used as the liquid LQ.

The exposure apparatus EX uses the immersion system 1, at least while projecting a pattern image of the mask M onto the substrate P, to fill the optical path space K of the exposure light EL with the liquid LQ. The exposure apparatus EX illuminates the exposure light EL which has passed through the mask M via the projection optical system PL and the liquid LQ which is filled in the optical path space K of the exposure light EL, onto the substrate P held in the substrate holder 4H, to thereby project the pattern image of the mask M onto the substrate P to expose the substrate P. Furthermore, the exposure apparatus EX of the present embodiment adopts a local liquid immersion method where the liquid LQ which fills the optical path space K between the first optical element LS1 and the substrate P locally forms an immersion region LR of the liquid LQ which is greater than a projection region AR, and smaller than the substrate P, on a region of one part of the substrate P which includes the projection region AR of the projection optical system PL.

In the present embodiment, the case where mainly the immersion region LR is formed on the substrate P is described. However, the immersion region LR can also be formed on an object which is arranged at a position opposite to the bottom surface of the first optical element LS1 on the image plane side of the projection optical system PL, for example on one part of the substrate stage 4, on a measurement stage movable independently of the substrate stage 4, or the like.

The illumination optical system IL is one which illuminates a predetermined illumination region on the mask M with the exposure light EL of a uniform luminance distribution. For the exposure light EL radiated from the illumination optical system IL, for example emission lines (g-line, h-line, i-line), radiated for example from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In the present embodiment, the ArF excimer laser beam is used.

The mask stage 3 is movable in the X axis, the Y axis direction, and the θZ direction in a condition holding the mask M, by means of drive from a mask stage driving apparatus 3D which includes an actuator such as a linear motor. Position information of the mask stage 3 (and consequently the mask M) is measured by a laser interferometer 3L. The laser interferometer 3L uses a movement mirror 3K which is provided on the mask stage 3 to measure the position information of the mask stage 3. The control apparatus 7 drives the mask stage driving apparatus 3D based on the measured results of the laser interferometer 3L to control the position of the mask M which is held in the mask stage 3.

The movement mirror 3K may include not only a plane mirror, but also a corner cube (retroreflector), and instead of securing the movement mirror 3K to the mask stage 3, a reflection surface may be used which is formed by mirror polishing for example the end face (side face) of the mask stage 3. Furthermore, the mask stage 3 may be of a construction capable of coarse/fine movement as disclosed for example in Japanese Patent Application, Publication No. H08-130179 A (corresponding to U.S. Pat. No. 6,721,034).

The projection optical system PL is one which projects a pattern image of the mask M onto the substrate P at a predetermined projection magnification, and has a plurality of optical elements, and these optical elements are held in a lens barrel PK. The projection optical system PL of the present embodiment is a reduction system with a projection magnification of for example ¼, ⅕, ⅛ or the like, and forms a reduced image of the mask pattern on the aforementioned illumination region and the conjugate projection region AR. The projection optical system PL may be a reduction system, an equal system or a magnification system. In the present embodiment, an optical axis AX of the projection optical system PL is parallel to the Z axis direction. Furthermore, the projection optical system PL may include any one of: a refractive system which does not include a reflection optical element, a reflection system which does not include a refractive optical element, or a cata-dioptric system which includes a reflection optical system and a refractive optical system. Moreover, the projection optical system PL may form either an inverted image or an erect image.

The substrate stage 4 has the substrate holder 4H for holding the substrate P. The substrate stage 4 is movable in a direction of six degrees of freedom of: the X axis, the Y axis, the Z axis, the θX, the θY and the θZ directions on a base material BP, in a condition with the substrate P held in the substrate holder 4H, by means of drive from a substrate stage driving apparatus 4D which includes an actuator such as a linear motor. The substrate holder 4H is arranged in a recessed portion 4R which is provided in the substrate stage 4, and an upper surface 4F of the substrate stage 4 other than the recessed portion 4R becomes a flat surface of approximately the same height (flush) as the surface of the substrate P which is held in the substrate holder 4H. There may be a height difference between the surface of the substrate P held in the substrate holder 4H and the upper surface 4F of the substrate stage 4. Moreover, only one part of the upper surface 4F of the substrate stage 4, for example, a predetermined region surrounding the substrate P, may be approximately the same height as the surface of the substrate P. Furthermore, the substrate holder 4H may be formed as one with one part of the substrate stage 4. However, in the present embodiment, the substrate holder 4H and the substrate stage 4 are made separate, and the substrate holder 4H is secured in the recessed portion 4R by, for example, vacuum attraction.

Position information of the substrate stage 4 (and consequently the substrate P) is measured by a laser interferometer 4L. The laser interferometer 4L uses a movement mirror 4K which is provided on the substrate stage 4 to measure the position information of the substrate stage 4 in relation to the X axis, the Y axis, and the θZ directions. Furthermore, surface position information of the surface of the substrate P held in the substrate stage 4 (position information related to the Z axis, the θX, and the θY directions) is detected by a focus leveling detection system (not shown in the figure). The control apparatus 7 drives the substrate stage driving apparatus 4D based on the detection results of the laser interferometer 4L, and the detection results of the focus leveling detection system, to control the position of the substrate P which is held in the substrate stage 4.

The laser interferometer 4L may also be capable of measuring the position in the Z axis direction of the substrate stage 4, and the rotation information in the θX and the θY directions. More detail of this is disclosed for example in Published Japanese Translation No. 2001-510577 of PCT International Application (corresponding to PCT International Publication No. WO 1999/28790). Furthermore, instead of fixing the movement mirror 4K to the substrate stage 4, a reflection surface may be used which is formed by mirror polishing for example a part of the substrate stage 4 (the side face or the like).

Furthermore, the focus leveling detection system is one which detects inclination information (rotation angle) for the θX and the θY directions of the substrate P by measuring position information for a plurality of measurement points for the Z axis direction of the substrate P. Regarding this plurality of measurement points, at least one part may be set within the immersion region LR (or the projection region AR), or all of these may be set on the outside of the immersion region LR.

Moreover, when for example the laser interferometer 4L is capable of measuring the position information for the Z axis, the θX, and the θY directions of the substrate P, then it is possible to measure the position information for the Z axis direction during the exposure operation of the substrate P, and hence the focus leveling detection system need not be provided, and position control of the substrate P in relation to the Z axis, the θX, and the θY directions can be performed using the measurement results of the laser interferometer 4L, at least during the exposure operation.

Figure 2:
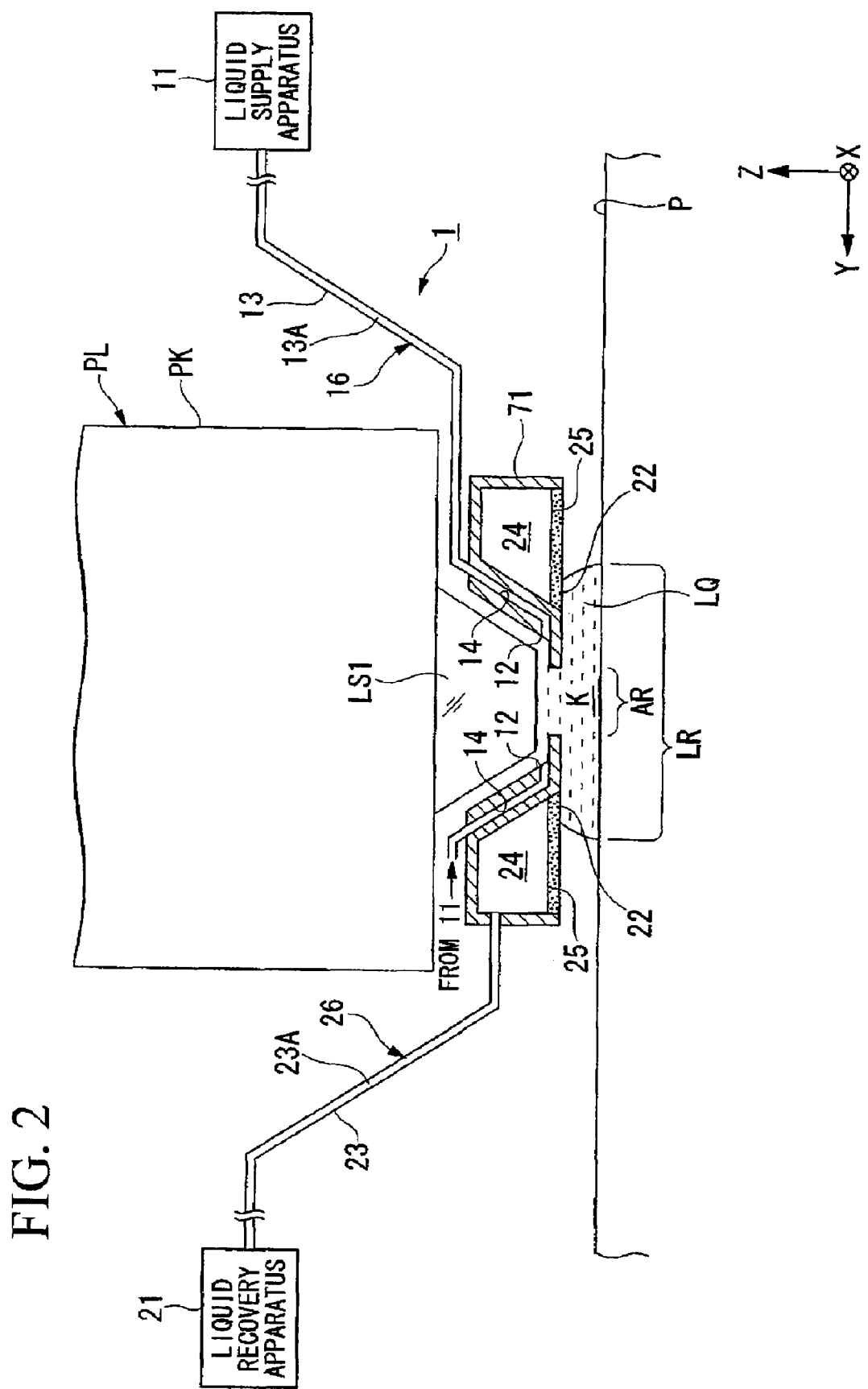
FIG. 2 is a side sectional view showing an immersion system according to the first embodiment.

Next is a description of the immersion system 1 with reference to FIG. 2. FIG. 2 is an enlarged cross-sectional view of the main part of FIG. 1. The immersion system 1 is one that fills with a liquid LQ an optical path space K of the exposure light EL between the bottom surface of the first optical element LS1 of the projection optical system PL and an object which is arranged at a position facing the bottom surface of the first optical element LS1, for example the surface of the substrate P which is held in the substrate holder 4H. The immersion system 1 includes: a nozzle member 71 provided in the vicinity of the optical path space K of the exposure light EL between the bottom surface of the first optical element LS1 and the surface of the substrate P, the nozzle member 71 having a supply port 12 for supplying the liquid LQ to the optical path space K and a recovery port 22 for recovering the liquid LQ; a liquid supply apparatus 11 that supplies the liquid LQ to the supply port 12 via a passage 13A of a supply pipe 13 and a first passage 14 formed inside the nozzle member 71; and a liquid recovery apparatus 21 that recovers the liquid LQ that has been recovered from the recovery port 22 of the nozzle member 71, via a second passage 24 formed inside the nozzle member 71 and a passage 23A of a recovery pipe 23. The supply port 12 and the passage 13A of the supply pipe 13 are connected to each other via the first passage 14. The recovery port 22 and the passage 23A of the recovery pipe 23 are connected to each other via the second passage 24. In the present embodiment, the nozzle member 71 is provided in an annular shape so as to surround the optical path space K of the exposure light EL; the supply port 12 for supplying the liquid LQ is provided on an inside surface, of the nozzle member 71, which faces the optical path space K of the exposure light EL; and the recovery port 22 for recovering the liquid LQ is provided on a bottom surface, of the nozzle member 71, which faces the surface of the substrate P. Moreover, in the present embodiment, a porous member 25 is arranged on the recovery port 22. Note that the member for forming the supply passage 16 is formed of a fluoroplastic or titanium in the present embodiment. However, a contact surface of the supply passage 16 with the liquid LQ may be coated with an above-mentioned material, which does not readily elute a predetermined substance.

The liquid supply apparatus 11 is capable of sending out the clean, temperature-adjusted liquid LQ. The liquid recovery apparatus 21 includes a vacuum system or the like, and is capable of recovering the liquid LQ. Operations of the liquid supply apparatus 11 and the liquid recovery apparatus 21 are controlled by the control apparatus 7. The liquid LQ sent from the liquid supply apparatus 11, after flowing through the passage 13A of the supply pipe 13 and the first passage 14 of the nozzle member 71, is supplied from the supply port 12 to the optical path space K of the exposure light EL. The liquid LQ that has been recovered from the recovery port 22 by the driven liquid recovery apparatus 21, after flowing through the second passage 24 of the nozzle member 71, is recovered into the liquid recovery apparatus 21 via the passage 23A of the recovery pipe 23.

In this manner, the passage 13A of the supply pipe 13 and the first passage 14 of the nozzle member 71 form a part of the supply passage 16 that supplies the liquid LQ to the supply port 12. The passage 23A of the recovery pipe 23 and the second passage 24 of the nozzle member 71 form a part of a recovery passage 26 that recovers the liquid LQ.

Figure 3:
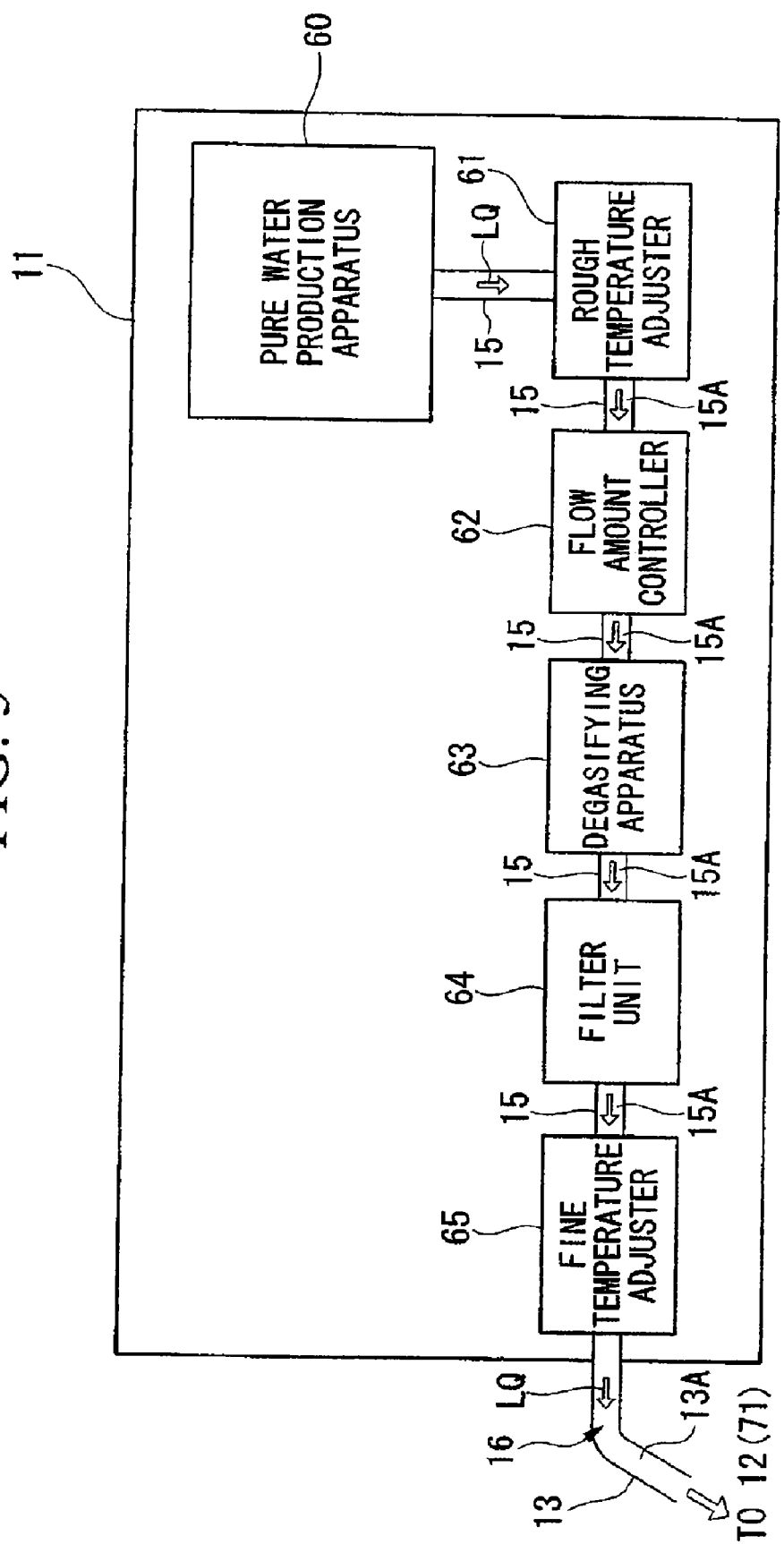
FIG. 3 shows one example of a liquid supply apparatus.

FIG. 3 shows one example of a liquid supply apparatus 11. The liquid supply apparatus 11 includes: a pure water production apparatus 60; a rough temperature adjuster 61 for roughly adjusting the temperature of the liquid LQ that is produced in and sent out from the pure water production apparatus 60; a flow amount controller 62 that is provided on the downstream side of the rough temperature adjuster 61 (on the supply pipe 13 side) and controls an amount per unit time of the liquid LQ to be flowed on the supply pipe 13 side; a degasifying apparatus 63 for decreasing the dissolved gas concentration (dissolved oxygen concentration, dissolved nitrogen concentration) in the liquid LQ that has passed through the flow amount controller 62; a filter unit 64 for removing foreign matter (bubbles, particles, etc.) in the liquid LQ that has been degasified by the degasifying apparatus 63; and a fine temperature adjuster 65 for finely adjusting the temperature of the liquid LQ that has passed through the filter unit 64. The pure water production apparatus 60, the rough temperature adjuster 61, the flow amount controller 62, the degasifying apparatus 63, the filter unit 64, and the fine temperature adjuster 65 are connected to each other via connection pipes 15, and hence the liquid LQ flows through passages 15A of the connection pipes 15. Moreover, although not shown in the figure, the liquid supply apparatus 11 further includes: a tank that stores the liquid LQ, a pressurizing pump, and the like.

Thus, in the present embodiment, the supply passage 16 for supplying the liquid LQ to the supply port 12 includes: the passage 13A of the supply pipe 13; and the first passage 14 of the nozzle member 71, and further includes: passages, through which the liquid LQ flows, in the various units such as the tank, the pressurizing pump, the pure water production apparatus 60, the rough temperature adjuster 61, the flow amount controller 62, the degasifying apparatus 63, the filter unit 64, and the fine temperature adjuster 65; and passages inside the liquid supply apparatus 11 such as the passages 15A of the connection pipes 15.

In the present embodiment, an amount of a predetermined substance mixed into the liquid LQ in the supply passage 16 is set to be not greater than a predetermined value. Here, the predetermined substance includes an eluted substance that is eluted into the liquid LQ from a member constituting the liquid supply apparatus 11 (such as a connection pipe 15), supply pipe 13, and nozzle member 71 that form the supply passage 16. To be more specific, the predetermined substance includes at least a part of metal, boron, and anion. For example, as the predetermined substance, iron (Fe), nickel (Ni), chromium (Cr), molybdenum (Mo), manganese (Mn), sodium (Na), silicon (Si), potassium (K), titanium (Ti), etc. may be listed.

In the present embodiment, an amount of mixture of the metal in the liquid LQ is set to be not greater than 1 ppt. In other words, the concentration of the metal in the liquid LQ when the metal is mixed is set to be not greater than 1 ppt ($1 \times 10^{-10}$%). Here, the amount of mixture of metal in the liquid LQ means a total amount of all types of metal mixed in the liquid LQ.

Furthermore, an amount of mixture of the boron in the liquid LQ is set to be not greater than 5 ppt. In other words, the concentration of the boron in the liquid LQ when the boron is mixed is set to be less or equal to 5 ppt ($5 \times 10^{-10}$%).

Furthermore, an amount of mixture of the anion in the liquid LQ is set to be not greater than 5 ppt. In other words, the concentration of the anion in the liquid LQ when the anion is mixed is set to be less or equal to 5 ppt ($5 \times 10^{-10}$%).

The predetermined substance includes a gas component (such as air and oxygen). In the present embodiment, an amount of mixture of the gas component in the liquid LQ is set to be not greater than 10 ppb, preferably not greater than 3 ppb. In other words, the concentration of the gas component in the liquid LQ when the gas component is mixed is set to be less or equal to 10 ppb ($10 \times 10^{-7}$%), preferably be less or equal to 3 ppb ($3 \times 10^{-7}$%).

In the present embodiment, in order to suppress the amount of these types of predetermined substance (eluted substance) mixed in the liquid LQ not greater than the predetermined value, an optimal material for forming the supply passage 16 such as the supply pipe 13 and the nozzle member 71, that is, a material which does not readily mix (elute) the predetermined substance into the liquid LQ is selected. In the present embodiment, the supply pipe 13 is formed of a fluoroplastic. For example, the supply pipe 13 is formed of a material that includes a fluoroplastic such as PTFE (polytetrafluroethelene) and PFA (tetrafluoroethylene-perfluoroalkoxy ethylene copolymer). These materials are the materials that do not readily elute the aforementioned predetermined substance into the liquid (water) LQ. Furthermore, the nozzle member 71 is formed of, for example, titanium. Titanium is also a material that does not readily elute the aforementioned substance into the liquid (water) LQ, because an oxide film is formed on the surface of titanium.

Note that, in the present embodiment, the members which form the supply passage 16 are formed of a fluoroplastic, titanium, or the like. However, the contact surface of the supply passage 16 with the liquid LQ may be coated with an above-mentioned material which does not readily elute the predetermined substance.

Furthermore, there is a possibility that various units of the liquid supply apparatus 11 such as the tank, the pressurizing pump, the pure water production apparatus 60, the rough temperature adjuster 61, the flow amount controller 62, the degasifying apparatus 63, the filter unit 64, and the fine temperature adjuster 65, and the connection pipes 15 will mix the predetermined substance into the liquid LQ as a result of contact with the liquid LQ, etc. However, in the present embodiment, the amount of the predetermined substance that is mixed from these various units and the connection pipes 15 into the liquid LQ is set to be not greater than a predetermined value.

That is, the amount (the concentration) of the predetermined substance included in the liquid LQ when the liquid LQ has reached the supply pipe 13 after flowing through the supply passage 16 formed of the liquid supply apparatus 11, the nozzle member 71, and the supply port 12, in other words, the amount (the concentration) of the predetermined substance included in the liquid LQ when the liquid LQ is supplied from the supply port 12 to the optical path space K of the exposure light EL, is set to be not greater than the aforementioned predetermined value.

Next is a description of the method of exposing the substrate P using the exposure apparatus EX which has the above configuration. In order to expose the substrate P, the control apparatus 7 controls the immersion system 1 to supply the liquid LQ from the liquid supply apparatus 11 to the supply port 12 via the passage 13A of the supply pipe 13 and the first passage 14 of the nozzle member 71. The liquid LQ which has been supplied from the supply port 12 to the optical path space K of the exposure light EL between the bottom surface of the first optical element LS1 and the surface of the substrate P, fills the optical path space K to locally form an immersion region LR on a region of one portion of the substrate P. The exposure apparatus EX of the present embodiment is a scanning type exposure apparatus (a so called scanning stepper) which projects the pattern formed on the mask M onto the substrate P while the mask M and the substrate P are synchronously moved in a scanning direction. When exposing the substrate P, the control apparatus 7 performs the liquid supply operation from the liquid supply port 12 in parallel with the liquid recovery operation via the liquid recovery port 22. At the same time, while synchronously moving the substrate stage 4 which holds the substrate P and the mask stage 3 which holds the mask M in a predetermined scanning direction (for example the Y axis direction), the control apparatus 7 projects the pattern image on the mask M onto the substrate P via the projection optical system PL and the liquid LQ which fills the optical path space K.

As described above, in the present embodiment, optimal materials for forming the supply passage 16, that is, the materials which do not readily mix the predetermined substance into the liquid LQ are selected, and hence the amount of the predetermined substance mixed into the liquid LQ which flows through the supply passage 16 can be made not greater than the predetermined value. Therefore, the amount (the concentration) of the predetermined substance can be suppressed in the liquid LQ which is supplied from the supply port 12 to the optical path space K of the exposure light EL.

In the case where a large quantity of metal, boron, anion, etc. among the types of predetermined substance is included in the liquid LQ that fills the optical path space K, there is a possibility that if the liquid LQ contacts the substrate P, defective exposure occurs due to at least a part of the metal, boron, and anion, such as contamination of the substrate P, and defects occur in the pattern formed on the substrate P. Furthermore, there is a possibility that, for example, the intensity and/or the uniformity of intensity of the exposure light EL, or the imaging characteristics of the projection optical system PL is decreased due to the liquid LQ attached to the liquid contact surface of the first optical element LS1. Furthermore, if a large quantity of gas component is included the liquid LQ, there is a possibility that bubbles are generated in the liquid LQ which fills the optical path space K. Because the bubbles generated in the liquid LQ act as foreign materials, there is a possibility that defective exposure occurs when the substrate P is exposed via the liquid LQ, such as defects in the pattern formed on the substrate P. In the present embodiment, the amount of the predetermined substance mixed into the liquid LQ in the supply passage 16 is suppressed. Consequently, the amount (the concentration) of the predetermined substance can be suppressed in the liquid LQ which is supplied, after flowing through the supply passage 16, from the supply port 12 to the optical path space K. Therefore, the occurrence of defective exposure can be suppressed.

As described above, the amount of the predetermined substance mixed into the liquid LQ in the supply passage 16 is set to be not greater than the predetermined value. Therefore, the amount of the predetermined substance can be suppressed in the liquid LQ that is supplied to the optical path space K of the exposure light EL, the contamination of the substrate P and the occurrence of generation of bubbles in the liquid LQ can be prevented, and the occurrence of defective exposure can be suppressed.

In the aforementioned embodiment, the supply pipe 13 is formed of a fluoroplastic, and the nozzle member 71 is formed of titanium. However, the supply pipes 13 may be formed of titanium, and the nozzle member 71 may be formed of a fluoroplastic. Alternatively, both of the supply pipe 13 and the nozzle member 71 may be formed of either titanium or a fluoroplastic. Furthermore, the members which form the supply passage 16 may be formed of a predetermined material, and the members may be subjected to a predetermined surface treatment to suppress an amount of the eluted substance that is eluted from the members into the liquid LQ. For example, the supply pies 13 may be formed of a stainless steel, and the supply pipes may be subjected to a treatment of attaching a chromic oxide. Such a treatment includes a "GOLDEP" treatment or a "GOLDEP WHITE" treatment developed by Kobelco Eco-Solutions Co., Ltd. With the surface treatment like these, an amount of the predetermined substance can be suppressed that are eluted from a member such as the supply pipe 13 into the liquid LQ. In the aforementioned embodiment, the supply pipe 13 and the nozzle member 71 suppress the generation of the eluted substance. However, the members that suppress the generation of the eluted substance are not limited to these.

In the aforementioned embodiment, the exposure apparatus EX need not include all of the pressurizing pump, pure water production apparatus 60, rough temperature adjuster 61, flow amount controller 62, degasifying apparatus 63, filter unit 64, fine temperature adjuster 65, etc. of the liquid supply apparatus 11. For example, predetermined units such as the extra pure water production apparatus 60 may be substituted by equipment of the factory or the like where the exposure apparatus EX is installed. Even in that case, by setting an amount of the predetermined substance mixed into the liquid LQ in the supply passage 16 of the exposure apparatus EX not greater than the predetermined value, the optical path space K of the exposure light EL can be filled with the liquid LQ in a desired state.

Note that the immersion system 1 described in the aforementioned embodiment is but one example, and various configurations can be adopted. Even in that case, by setting an amount of the predetermined substance mixed into the liquid LQ in the supply passage 16 which supplies the liquid LQ to the supply port 12 not greater than the predetermined value, the optical path space K of the exposure light EL can be filled with the liquid LQ in a desired state.

Furthermore, it is desirable that an amount of the predetermined substance not only from the supply passage 16 but also from other members to be in contact with the liquid LQ in the immersion region LR (for example, the substrate stage 4) be made as small as possible.

Second Embodiment

Figure 4:
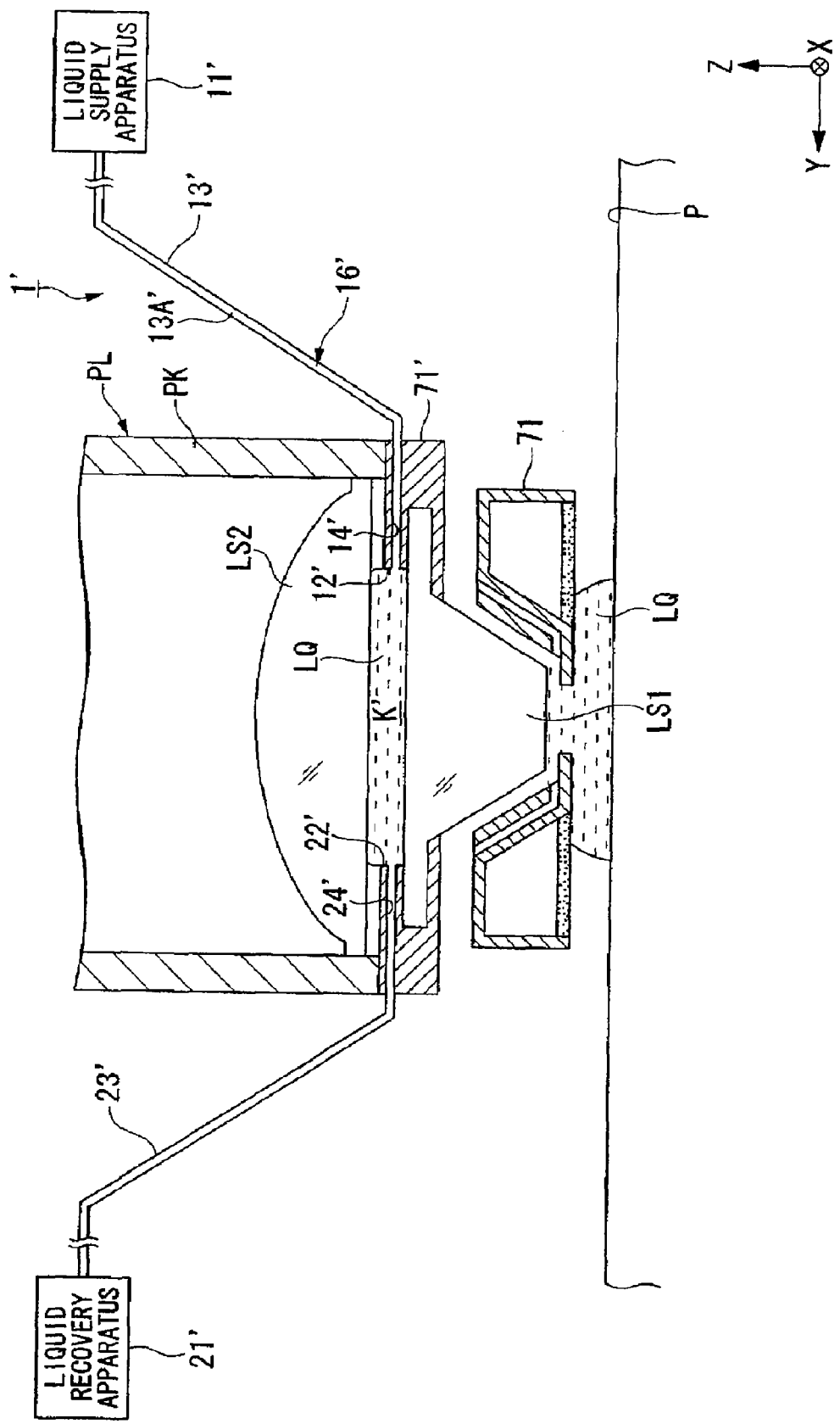
FIG. 4 is a side sectional view showing an exposure apparatus according to a second embodiment.

Next is a description of a second embodiment with reference to FIG. 4. In the following description, components the same as or similar to those of the aforementioned embodiment are denoted by the same reference symbols, and description thereof is simplified or omitted. In the aforementioned embodiment, the amount of the predetermined substance mixed into the liquid LQ that is supplied via the supply port 12 to the optical path space K of the exposure light EL between the bottom surface of the first optical element LS1 and the surface of the substrate P is set to be not greater than the predetermined value. However, as is disclosed in PCT International Patent Publication No. WO 2004/019128, an amount of the predetermined substance that is mixed in the liquid LQ into the optical path space on the object plane side (the mask M side) of the first optical element LS1 can be set to be not greater than the predetermined value.

In FIG. 4, an exposure apparatus EX includes an immersion system 1' for supplying a liquid LQ to between an upper surface of a first optical element LS1 that is closest to an image plane of a projection optical system PL among a plurality of optical elements of the projection optical system PL and a bottom surface of a second optical element LS2 that is second closest to the image plane of the projecting optical system PL after the first optical element LS1.

The immersion system 1' includes: a supply port 12' for supplying the liquid LQ to an optical path space K' of exposure light EL between the first optical element LS1 and the second optical element LS2; and a recovery port 22' for recovering the liquid LQ. The immersion system 1' has substantially the same construction as the aforementioned immersion system 1 described for the aforementioned embodiment. To the supply port 12', the liquid LQ is supplied from a liquid supply apparatus 11' via a passage 13A' of a supply pipe 13' and a first passage 14' of a nozzle member 71'. In a supply passage 16' that supplies the liquid LQ to the supply port 12', an amount of the predetermined substance mixed into the liquid LQ is set to be not greater than the predetermined value. As a result, the occurrence of the undesirable situation can be prevented such as: a contamination of the liquid LQ, an upper surface of the first optical element LS1, and a bottom surface of the second optical element LS2; and the generation of bubbles in the liquid LQ, and thereby the occurrence of defective exposure can be suppressed.

Similarly to the aforementioned first embodiment, it may be configured such that the generation of the eluted substance is suppressed also in the supply passage 16 of the immersion system 1 that supplies the liquid LQ to the optical path space K between the first optical element LS1 and the substrate P. In the present embodiment, the immersion system 1' is provided separate to the immersion system 1. However, at least one part of the immersion system 1' may be used in conjunction with the immersion system 1.

There is a possibility that the predetermined substance in the liquid LQ influences not only the exposure of the substrate P, but also the various measurements that are performed via the liquid LQ. However, as in the aforementioned first and second embodiments, by suppressing the amount of the predetermined substance mixed into the liquid LQ not greater than the predetermined value, the various measurements that are performed via the liquid LQ can be executed with high accuracy. Consequently, the exposure of the substrate P executed based on these measurements can also be favorably performed.

In the aforementioned first and second embodiments, in the case where the supply passage 16 (16') is cleaned using a predetermined cleaning liquid (cleaning chemical) including a hydrogen peroxide solution, an ABZOL cleaner, or the like, it is preferable that after cleaning, the cleaning chemical remaining in the supply passage 16 (16') be sufficiently removed to suppress the amount of the predetermined substance mixed in the liquid LQ not greater than the predetermined value when the substrate P is exposed, the liquid LQ being supplied to the optical path space K (K') of the exposure light EL.

Third Embodiment

Next is a description of a third embodiment. In the following description, components the same as or similar to those of the aforementioned embodiments are denoted by the same reference symbols, and description thereof is simplified or omitted.

Figure 5:
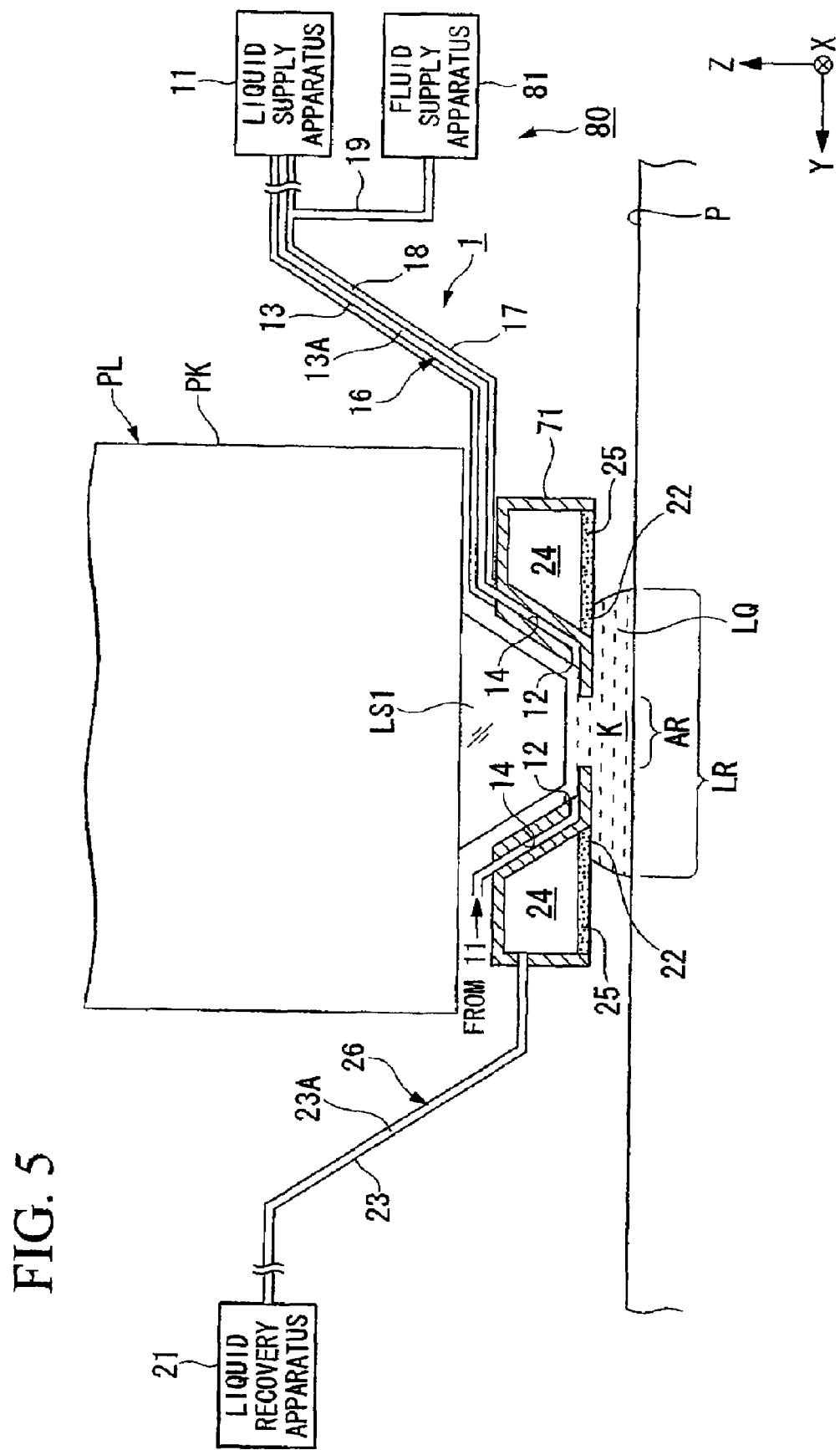
FIG. 5 is a side sectional view showing an immersion system according to a third embodiment.

FIG. 5 shows a main part of an exposure apparatus EX according to a third embodiment. Similarly to the aforementioned embodiments, the exposure apparatus EX includes: a nozzle member 71 that has a supply port 12 and a recovery port 22; a liquid supply apparatus 11 for supplying a liquid LQ to the supply port 12 via a passage 13A of a supply pipe 13 and a first passage 14; and a liquid recovery apparatus 21 for recovering the liquid LQ that has been recovered from the recovery port 22 via a second passage 24 and a passage 23A of a recovery pipe 23. The supply pipe 13 forms a supply passage 16 for supplying the liquid LQ to the supply port 12.

The supply pipe 13 is permeable to a predetermined gas. The supply pipe 13 allows a gas to permeate due to a characteristic of the material that forms the supply pipe 13. For example, in the case where the supply pipe 13 is formed of a material that includes a fluoroplastic such as PFA (tetrafluoroethylene-perfluoroalkoxy ethylene copolymer) and PTFE (polytetrafluroethelene), the supply pipe 13 has a property of being permeable to oxygen due to oxygen permeability of a fluoroplastic. In the following description, a predetermined gas that is capable of permeating through the supply pipe 13 is appropriately referred to as the first gas.

In the present embodiment, the supply pipe 13 is formed of PFA among fluoroplastics, and hence the supply pipe 13 is permeable to oxygen. Therefore, the first gas in the present embodiment is oxygen.

The exposure apparatus EX of the present embodiment includes a prevention apparatus 80 for preventing deterioration of the liquid LQ in the supply passage 16 by the first gas that has permeated through the supply pipe 13. The prevention apparatus 80 reduces an amount of the first gas in a predetermined space 18 around the supply pipe 13. By reducing the amount of the first gas in the predetermined space 18, the prevention apparatus 80 reduces an amount of the first gas that permeates through the supply pipe 13 from the predetermined space 18, to be dissolved into the liquid LQ in the supply passage 16. As a result of a reduction in the amount of the first gas permeating into the supply passage 16, deterioration of the liquid LQ in the supply passage 16 by the first gas, that is, an increase in the gas component dissolved in the liquid LQ which flows through the supply passage 16 can be prevented. Therefore, it is possible to suppress: the generation of bubbles in the liquid LQ which is supplied to the optical path space K via the supply passage 16; a decrease in transmissivity of the liquid LQ with respect to the exposure light EL; temperature change in the liquid LQ resulting from the decrease in transmissivity; and the like.

As shown in FIG. 5, in the present embodiment, an outer pipe 17 is arranged outside the supply pipe 13. The supply pipe 13 and the outer pipe 17 form a double pipe. In the present embodiment, the predetermined space 18 includes a space between the supply pipe 13 and the outer pipe 17, and the prevention apparatus 80 decreases the amount of the first gas in the predetermined space 18 between the supply pipe 13 and the outer pipe 17.

The prevention apparatus 80 includes a fluid supply apparatus 81 for supplying a fluid to the predetermined space 18 between the supply pipe 13 and the outer pipe 17. The prevention apparatus 80 fills the predetermined space 18 with the fluid supplied from the fluid supply apparatus 81. The fluid supply apparatus 81 supplies a predetermined fluid (including a liquid and a gas) to the predetermined space 18, to thereby expel the first gas present in the predetermined space 18 or decrease an amount of the first gas in the predetermined space 18.

Figure 6:
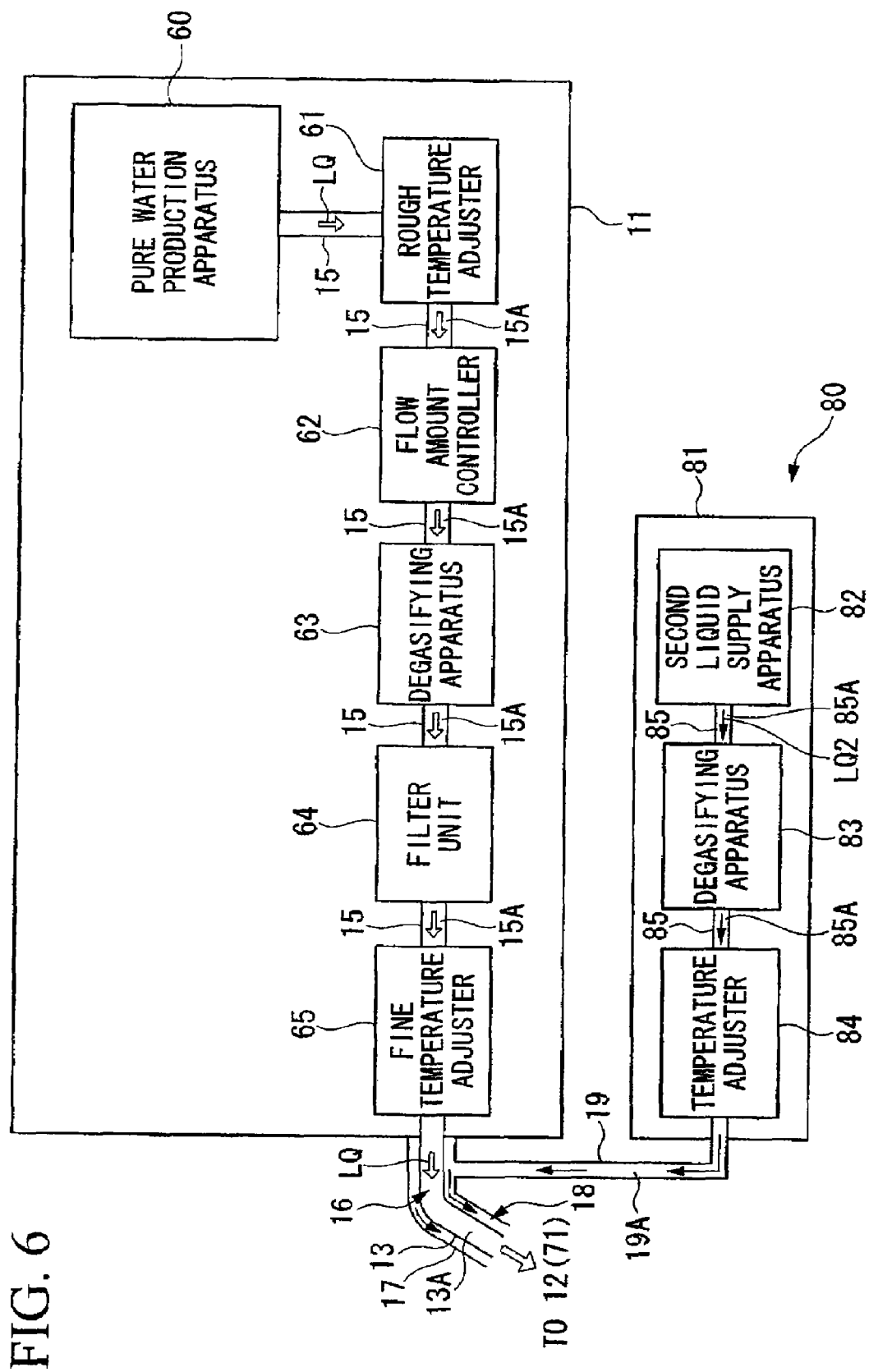
FIG. 6 shows one example of a prevention apparatus according to the third embodiment.

FIG. 6 shows one example of a fluid supply apparatus 81 and a liquid supply apparatus 11. In the present embodiment, the fluid supply apparatus 81 supplies a second liquid LQ2 to the predetermined space 18. The fluid supply apparatus 81 includes: a second liquid supply apparatus 82 for supplying the second liquid LQ2; a degasifying apparatus 83 for decreasing a dissolved gas concentration (such as dissolved oxygen concentration or dissolved nitrogen concentration) in the second liquid LQ2 which has been sent from the second liquid supply apparatus 82; and a temperature adjuster (a fine temperature adjuster) 84 for adjusting the temperature of the second liquid LQ which has been degasified by the degasifying apparatus 83. The second liquid supply apparatus 82, the degasifying apparatus 83, and the temperature adjuster 84 are connected to each other via connection pipes 85, and hence the second liquid LQ2 flows through passages 85A of the connection pipes 85.

The fluid supply apparatus 81 (the temperature adjuster 84) and the outer pipe 17 are connected to each other via a connection pipe 19, and hence the fluid supply apparatus 81 is capable of supplying the second liquid LQ2 to the predetermined space 18 via a passage 19A of the connection pipe 19. By supplying the second liquid LQ2 to the predetermined space 18 to fill the predetermined space 18 with the second liquid LQ2, the first gas present in the predetermined space 18 can be expelled or an amount of the first gas in the predetermined space 18 can be decreased.

As described above, the fluid supply apparatus 81 includes the degasifying apparatus 83. The second liquid LQ2 with the reduced first gas is supplied to the predetermined space 18. That is, the predetermined space 18 is filled with the second liquid LQ2 with the reduced first gas. Furthermore, the fluid supply apparatus 81, which includes the temperature adjuster 84, is capable of supplying the temperature-adjusted second liquid LQ2 to the predetermined space 18, and is capable of adjusting the temperature of the second liquid LQ2 within the predetermined space 18 by use of the temperature adjuster 84.

Figure 7:
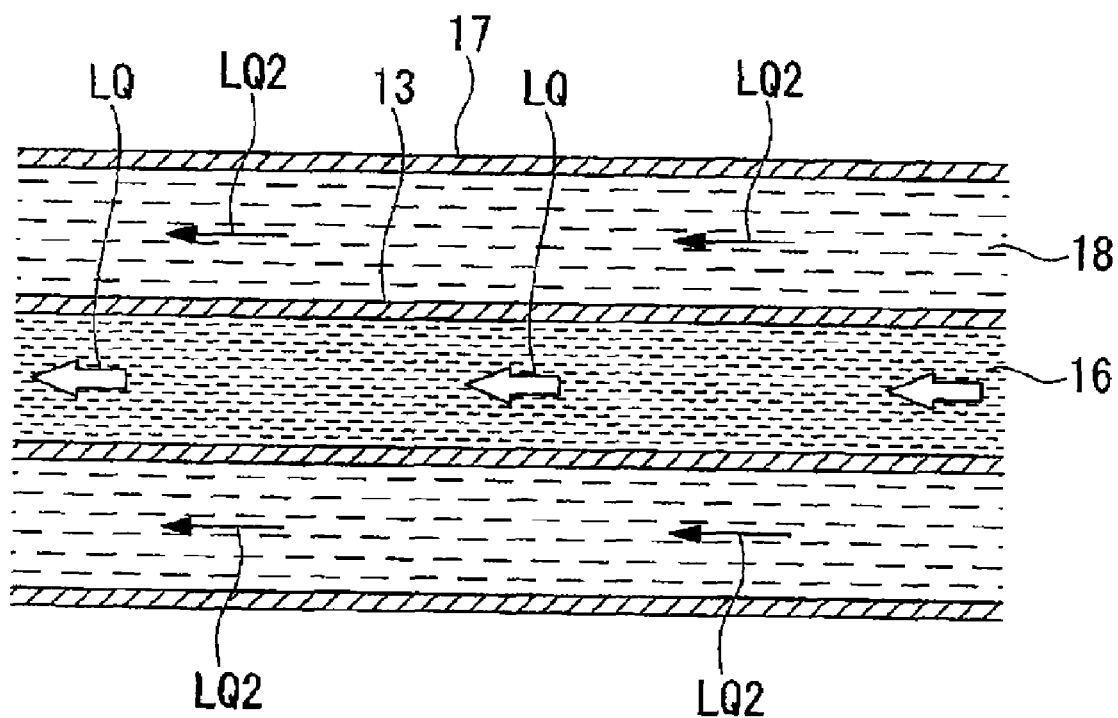
FIG. 7 is an enlarged view showing the vicinity of a supply passage according to the third embodiment.

FIG. 7 is a schematic diagram showing the liquid LQ that flows through the supply passage 16, and the second liquid LQ2 that fills the predetermined space 18. As described above, the predetermined space 18 is filled with the second liquid LQ2 with the reduced first gas. Therefore, even if the supply pipe 13 is permeable to the first gas, the amount (the concentration) of the first gas that permeates through the supply pipe 13 from the predetermined space 18, to be dissolved into the liquid LQ can be suppressed because the amount of the first gas in the predetermined space 18 is sufficiently reduced. By reducing the amount of the first gas that permeates into the supply passage 16, deterioration of the liquid LQ in the supply passage 16 by the first gas, that is, an increase in gas component dissolved in the liquid LQ which flows through the supply passage 16 can be prevented.

To the predetermined space 18, the second liquid LQ2 that has been temperature-adjusted by the temperature adjuster 84 is supplied. Therefore, the prevention apparatus 80 is capable of adjusting the temperature of the liquid LQ flowing through the supply passage 16 by means of the temperature-adjusted second liquid LQ2 via the supply pipe 13. That is, in the present embodiment, the prevention apparatus 80 also functions as a temperature adjuster for the liquid LQ. The predetermined space 18 around the supply pipe 13 is filled with the temperature-adjusted second liquid LQ2, and hence the supply pipe 13 is not exposed to a gas in the outside space (outside air). Therefore, a deterioration of the liquid LQ in the supply passage 16, that is, a temperature change in the liquid LQ flowing through the supply passage 16 can be prevented. Consequently, the situation where the temperature of the liquid LQ supplied to the optical path space K via that supply passage 16 changes can be suppressed.

The second liquid LQ2 that has been supplied from the fluid supply apparatus 81 to the predetermined space 18 is discharged from a discharge port provided in a part of the predetermined space 18 (the outer pipe 17), and then is, for example, returned to the second liquid supply apparatus 82 or sent to a predetermined processing apparatus. The prevention apparatus 80 can suppress the deterioration of the liquid LQ flowing through the supply passage 16 by continuously supplying the degasified, temperature-adjusted second liquid LQ2 from the fluid supply apparatus 81 to the predetermined space 18.

Furthermore, in the present embodiment, the outer pipe 17 for forming the predetermined space 18 is provided over almost the entirety of the supply pipe 13 connected to the liquid supply apparatus 11 (the fine temperature adjuster 65). The deterioration of the liquid LQ is suppressed by the prevention apparatus 80 immediately after the liquid LQ is sent out from the liquid supply apparatus 11 (the fine temperature adjuster 65) to the supply passage 16. Therefore, the deterioration of the liquid LQ which is degasified by the degasifying apparatus 63 and is temperature-adjusted by the fine temperature adjuster 65 can be sufficiently suppressed.

As described above, even if the supply pipe 13 is permeable to the first gas, the deterioration of the liquid LQ in the supply passage 16 by the first gas that has permeated through the supply pipe 13 can be suppressed. Therefore, the generation of bubbles in the liquid LQ; a decrease in transmissivity of the liquid LQ with respect to the exposure light EL; a temperature change in the liquid LQ; and the like are suppressed, and hence the occurrence of defective exposure can be suppressed.

In the third embodiment, the second liquid LQ2 that is supplied to the predetermined space 18 may be identical to or different from the liquid LQ that flows through the supply passage 16. That is, the second liquid LQ that flows through the predetermined space 18 may be pure water, which is of the same type as the liquid LQ that flows through the supply passage 16, or may be a predetermined liquid other than pure water.

Fourth Embodiment

Figure 8:
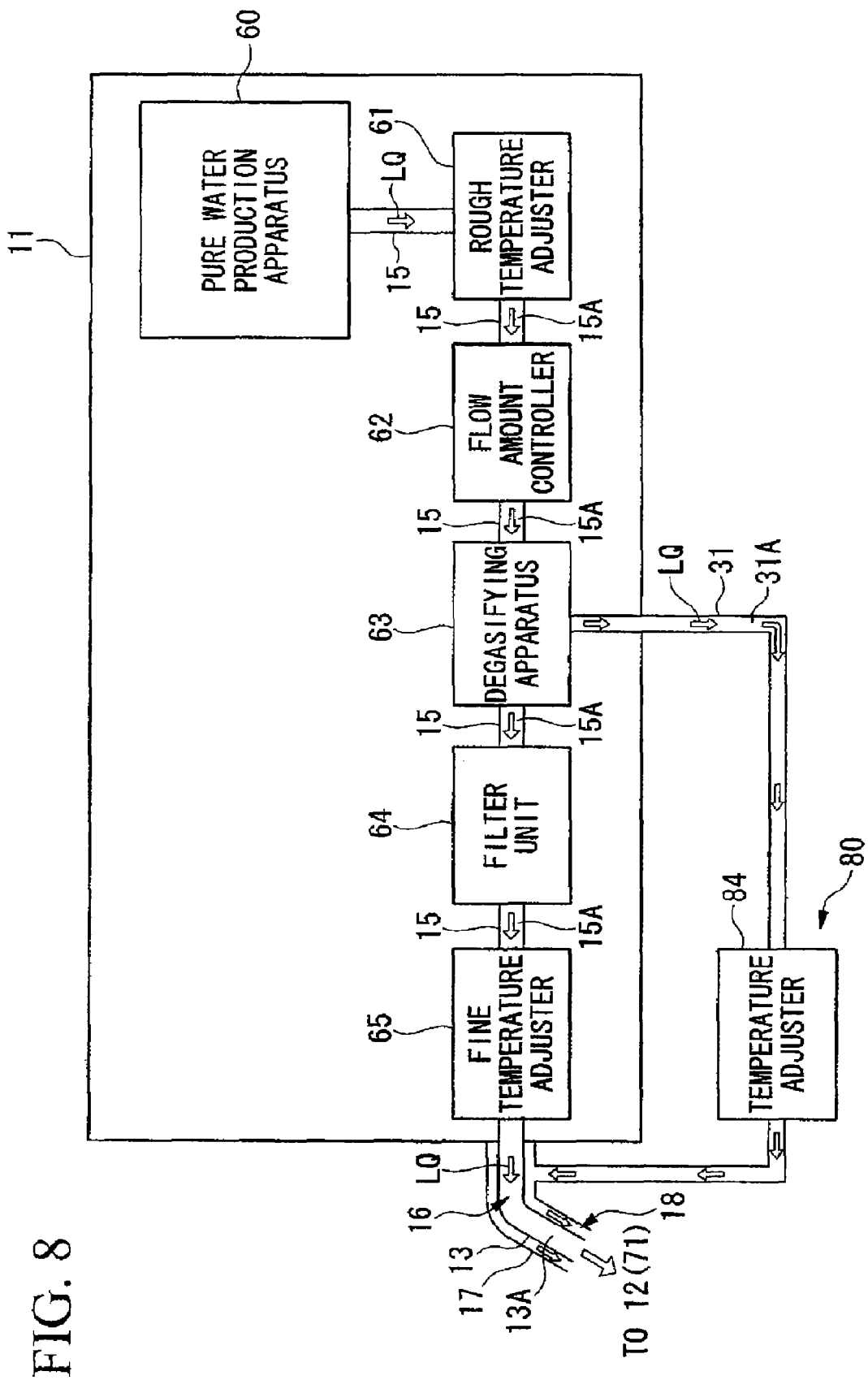
FIG. 8 shows one example of a prevention apparatus according to a fourth embodiment.

Next is a description of a fourth embodiment with reference to FIG. 8. This fourth embodiment is different from the aforementioned third embodiment only in the construction of the prevention apparatus 80. Therefore, components the same as or similar to those of the aforementioned embodiments are denoted by the same reference symbols, and description thereof is simplified or omitted. In the aforementioned third embodiment, as shown in FIG. 6, it is the liquid LQ sent from the liquid supply apparatus 11 (the pure water production apparatus 60) that flows through the supply passage 16, and it is the second liquid LQ2 sent from the fluid supply apparatus 81 different from the liquid supply apparatus 11 (the second liquid supply apparatus 82) that flows through the predetermined space 18. In the fourth embodiment, as shown in FIG. 8, a liquid LQ that has been sent from a liquid supply apparatus 11 (a pure water production apparatus 60) can be flowed to a supply passage 16 and a predetermined space 18, respectively. In the present embodiment, a degasifying apparatus 63 of the liquid supply apparatus 11 and the predetermined space 18 are connected to each other via a passage 31A of a connection pipe 31. The liquid LQ that has been sent from the degasifying apparatus 63 of the liquid supply apparatus 11 to the connection pipe 31, after being temperature-adjusted by a temperature adjuster (a fine temperature adjuster) provided part way along the connection pipe 31, is supplied to the predetermined space 18. In this manner, the liquid LQ may be supplied from the liquid supply apparatus 11 to the supply passage 16 and the predetermined space 18, respectively.

That is, in the fourth embodiment, at least a part of the liquid supply apparatus constitutes a part of a prevention apparatus 80.

Note that in the aforementioned third and fourth embodiments, the liquid (LQ2, LQ) is supplied to the predetermined space 18 via the temperature adjuster 84. However, the temperature adjuster 84 may be omitted. For example, in the case where the connection pipe 13 is formed of a material with characteristics of being permeable to the first gas and highly heat insulating, the temperature adjuster 84 can be omitted. Alternatively, in the aforementioned third and fourth embodiments, at least either one of the temperature adjusters 61 and 65 of the liquid supply apparatus 11 may be omitted, and the temperature of the liquid LQ flowing through the connection pipe 13 may be adjusted through the temperature adjustment of the liquid in the predetermined space 18 by the temperature adjuster 84.

Fifth Embodiment

Figure 9:
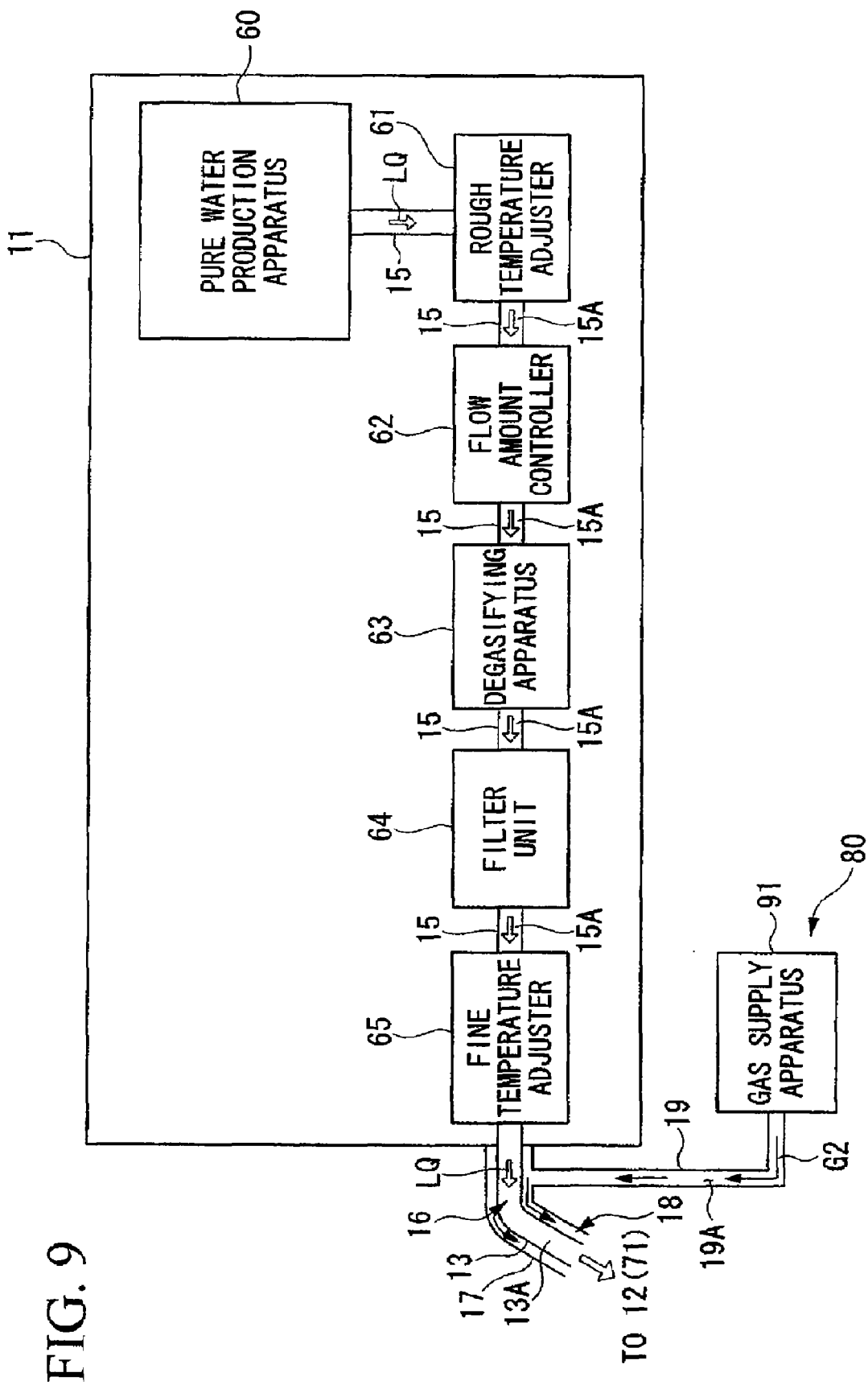
FIG. 9 shows one example of a prevention apparatus according to a fifth embodiment.

Next is a description of a fifth embodiment with reference to FIG. 9. This fifth embodiment is different from the aforementioned third and fourth embodiments only in the construction of the prevention apparatus 80. Therefore, components the same as or similar to those of the aforementioned embodiments are denoted by the same reference symbols, and description thereof is simplified or omitted. As shown in FIG. 9, an exposure apparatus EX of the fifth embodiment includes a prevention apparatus 80 for preventing a liquid LQ in a supply passage 16 from being deteriorated by a first gas that has permeated through a supply pipe 13. The prevention apparatus 80 of the present embodiment includes a gas supply apparatus 91 for supplying a second gas G2 to a predetermined space 18 between a supply pipe 13 and an outer pipe 17, the second gas G2 being different from the aforementioned first gas.

The gas supply apparatus 91 and the outer pipe 17 are connected to each other via a connection pipe 19. The gas supply apparatus 91 is capable of supplying the second gas G2 to the predetermined space 18 via a passage 19A of the connection pipe 19. The prevention apparatus 80 fills the predetermined space 18 with the second gas G2 which has been supplied from the gas supply apparatus 91. By supplying the second gas G2 to the predetermined space 18, the gas supply apparatus 91 is capable of expelling the first gas present in the predetermined space 18 or decreasing an amount (a concentration) of the first gas in the predetermined space 18. That is, in the present embodiment, the prevention apparatus 80 replaces (purges) the predetermined space 18 with the second gas G2.

The second gas G2 is a gas that does not substantially permeate through the supply pipe 13. The second gas G2 is determined according to the material that forms the supply pipe 13. As described above, in the present embodiment, the supply pipe 13 is formed of PFA. The first gas is oxygen. The second gas G2 is, for example, a nitrogen gas.

Figure 10:
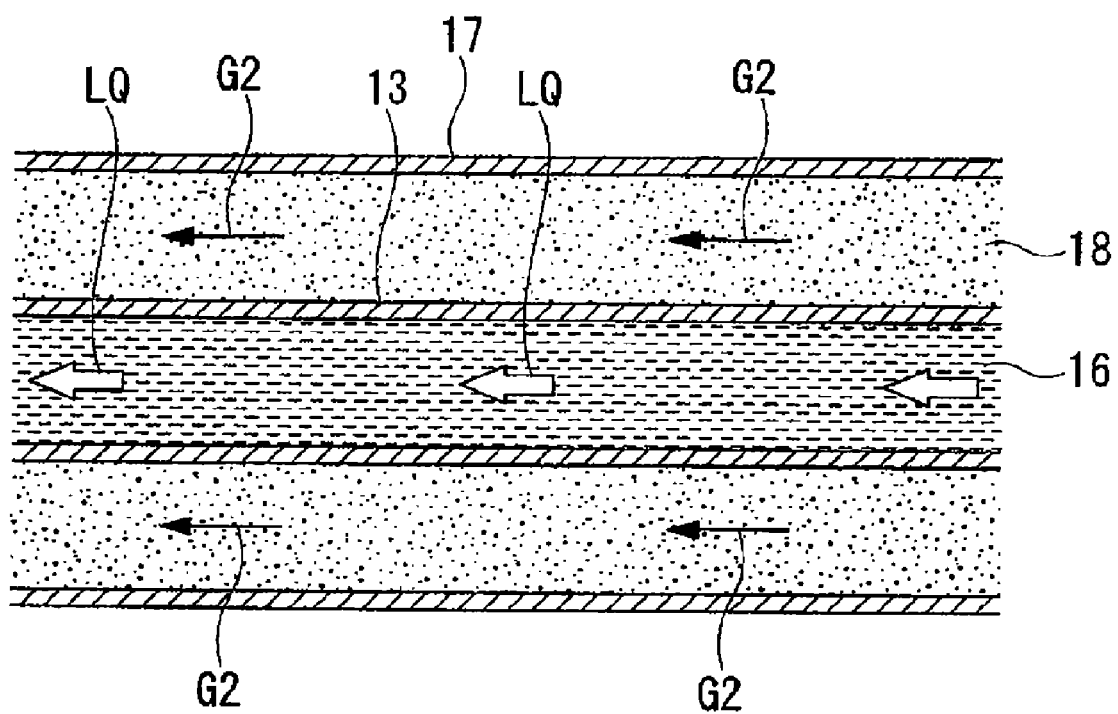
FIG. 10 is an enlarged view showing the vicinity of a supply passage according to the fifth embodiment.

FIG. 10 is a schematic diagram showing the liquid LQ that flows through the supply passage 16, and the second gas G2 that fills the predetermined space 18. As described above, the second gas G2 different from the first gas is supplied to the predetermined space 18, and the predetermined space 18 is filled with a gas with a reduced amount (concentration) of the first gas. Therefore, even if the supply pipe 13 is permeable to the first gas, the amount (the concentration) of the first gas that permeates through the supply pipe 13 from the predetermined space 18, to be dissolved into the liquid LQ can be suppressed because the amount of the first gas in the predetermined space 18 is sufficiently reduced. In the present embodiment, although the supply pipe 13 is permeable to the first gas, the predetermined space 18 is filled with the second gas G2 that does not substantially permeate through the supply pipe 13. Therefore, the permeation of the first and second gases into the supply passage 16 can be suppressed.

The second gas G2 that has been supplied from the gas supply apparatus 91 to the predetermined space 18 is discharged from a discharge port provided in a part of the predetermined space 18 (the outer pipe 17), and then is, for example, returned to the gas supply apparatus 91 or sent to a predetermined processing apparatus. The prevention apparatus 80 can suppress the deterioration of the liquid LQ flowing through the supply passage 16 by continuously supplying the second gas G2 from the gas supply apparatus 91 to the predetermined space 18.

Furthermore, in the present embodiment, the outer pipe 17 that forms the predetermined space 18 between itself and the supply pipe 13 is provided over almost the entirety of the supply pipe 13 connected to the liquid supply apparatus 11 (the fine temperature adjuster 65). The deterioration of the liquid LQ is suppressed by the prevention apparatus 80 immediately after the liquid LQ is sent from the liquid supply apparatus 11 (the fine temperature adjuster 65) to the supply passage 16. Therefore, the deterioration of the liquid LQ that flows through the supply passage 16 can be sufficiently suppressed.

Note that it is possible to provide, in the gas supply apparatus 91, a temperature adjuster for adjusting the temperature of the second gas G2 that is supplied to the predetermined space 18. The prevention apparatus 80 is capable of adjusting the temperature of the liquid LQ flowing through the supply passage 16 by means of the temperature-adjusted gas via the supply pipe 13.

As described above, even if the supply pipe 13 is permeable to the first gas, a deterioration of the liquid LQ in the supply passage 16 by the first gas, that is, an increase in gas component dissolved in the liquid LQ that flows through the supply passage 16 can be prevented by filling the predetermined space 18 with the second gas G2 that does not substantially permeate through the supply pipe 13. Therefore, the generation of bubbles in the liquid LQ; a decrease in transmissivity of the liquid LQ with respect to the exposure light EL; a temperature change in the liquid LQ; and the like are suppressed, and hence the occurrence of defective exposure can be suppressed.

In the fifth embodiment, the second gas G2 that is supplied to the predetermined space 18 is a nitrogen gas. However, the type of the second gas G2 is optionally selectable. Any gas can be used as long as it is a gas that does not permeate through the supply pipe 13 and has a desired capability. Furthermore, the second gas G2 is not limited to a gas that does not permeate through the supply pipe 13, but it may be any gas that does not practically deteriorate the liquid LQ in the supply passage 16 even if it has permeated through the supply pipe 13.

In the aforementioned third to fifth embodiments, the exposure apparatus EX need not include all the units of the prevention apparatus 80. A part of the prevention apparatus 80 (for example, the temperature adjuster and the like) may be substituted by equipment of the factory or the like where the exposure apparatus EX is installed.

Sixth Embodiment

Figure 11:
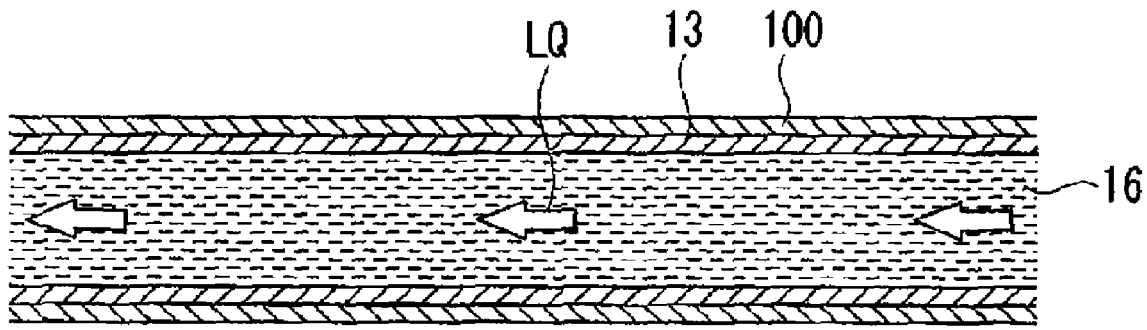
FIG. 11 is an enlarged view showing the vicinity of a supply passage according to a sixth embodiment.

Next is a description of a sixth embodiment with reference to FIG. 11. As shown in FIG. 11, an outer surface of the supply pipe 13 may be covered with a film 100 which is not permeable to the first gas. Alternatively, the outer surface of the supply pipe 13 may be covered with a film-like member which is not permeable to the first gas, that is, a film-like member which has a barrier property against the first gas. Also as a result of this, the permeation of the first gas into the supply passage 16 can be prevented.

Moreover, the supply pipe 13 may be covered with a vacuum insulation material. As a result, the dissolution of the first gas into the liquid LQ in the supply passage 16 via the supply pipe 13 can be prevented.

In the aforementioned sixth embodiment, the supply pipe 13 is covered with a barrier member such as a film 100, a film-like member, or a vacuum insulation material. However, at least a part of the supply pipe 13 may be made of a material that is not permeable to the first gas. For example, a supply pipe 13 may be used in which an inner surface (an inner wall) to be in contact with the liquid LQ is formed of a predetermined material (a fluoroplastic) that does not readily elute the aforementioned predetermined substance, and an outer surface (an outer wall) is formed of a material that is not permeable to the aforementioned first gas. Alternatively, a supply pipe 13 may be made of a material that is not permeable to the aforementioned first gas, and an inner surface thereof as a contact surface with the liquid LQ may be coated with a predetermined material (such as a fluoroplastic) that does not readily elute the aforementioned predetermined substance.

In the aforementioned third to sixth embodiments, the entirety of the supply pipe 13 between the liquid supply apparatus 11 and the nozzle member 71 is covered with the outer pipe 17 (or the barrier member). However, only a part thereof may be covered. Moreover, the covering is not limited to the supply pipe 13. The outside of another pipe (such as the connection pipe 15) may be covered with the outer pipe 17.

Furthermore, in the aforementioned third to sixth embodiments, the outer pipe 17 (or the barrier member) is provided so as to cover the supply pipe 13 and the like, to thereby prevent the permeation of the first gas into the supply passage 16 via the supply pipe 13 and the like. However, at least a part of the supply pipe 13 may be arranged in a chamber (not shown in the figure) in which the exposure apparatus EX is contained, to decrease an amount (a concentration) of the first gas in that chamber. This construction may be applied to the aforementioned first and second embodiments.

In the aforementioned embodiments, the construction of the nozzle member 71 (71') as an immersion formation apparatus for forming an immersion space by filling the optical path space (K, K') of the exposure light EL with the liquid LQ is not limited to the construction as described above. For example, a nozzle member (an immersion system) may be used as is disclosed for example in European Patent Publication No. EP 1,420,298, PCT International Patent Publication No. WO 2004/055803, PCT International Patent Publication No. WO 2004/057590, PCT International Patent Publication No. WO 2005/029559, PCT International Patent Publication No. WO 2004/086468 (corresponding to U.S. Patent Application, Publication No. 2005/0280791A1), Japanese Patent Application, Publication No. 2004-289126 A (corresponding to U.S. Pat. No. 6,952,253), and the like.

As described above, the liquid LQ in the aforementioned embodiments is pure water. Pure water has advantages in that it can be easily obtained in large quantity at semiconductor manufacturing plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the tip end surface of the projection optical system PL are cleaned. In the case where pure water supplied from plants, etc. has a low degree of purity, the exposure apparatus may have an extra pure water production apparatus.

In addition, the index of refraction n of pure water (water) with respect to exposure light EL with a wavelength of 193 nm is said to be about 1.44, so in the case where ArF excimer laser light (193 nm wavelength) is used as the light source of the exposure light EL, it is possible to shorten the wavelength to 1/n, that is, approximately 134 nm on the substrate P, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In the above embodiments, an optical element LS1 is attached to the tip end of the projection optical system PL, and this optical element LS1 can be used to adjust the optical characteristics, for example, the aberration (spherical aberration, coma aberration, etc.), of the projection optical system PL. Note that an optical plate used for the adjustment of the optical characteristics of the projection optical system PL may also be used as the optical element attached to the tip end of the projection optical system PL. Or, it may also be a plane-parallel plate through which the exposure light EL is able to pass.

In the case where the pressure between the substrate P and the optical element of the tip end of the projection optical system PL arising from the flow of the liquid LQ is large, it is permissible to make that optical element not one that is replaceable but one that is firmly secured so that the optical element does not move due to that pressure.

In the above embodiments, the configuration is one in which a liquid LQ is filled between the projection optical system PL and the surface of the substrate P, but it may also be a configuration in which the liquid LQ is filled in a status in which a cover glass consisting of a plane-parallel plate is attached to the surface of the substrate P, for example.

Note that the liquid LQ of the above embodiments is water (pure water), but it may be a liquid other than water. For example, if the light source of the exposure light EL is an $F_2$ laser, this $F_2$ laser light will not pass through water, so the liquid LQ may be, for example, a fluorocarbon fluid such as a perfluoropolyether (PFPE) or a fluorocarbon oil that an $F_2$ laser is able to pass through. In this case, the part to be in contact with the liquid LQ is applied with lyophilic treatment by forming a thin film using a substance with a molecular structure that has a small polarity including fluorine. In addition, it is also possible to use, as the liquid LQ, liquids that have the transmittance with respect to the exposure light EL and whose refractive index as are as high as possible and that are stable with respect to the photoresist coated on the projection optical system PL and/or the surface of the substrate P (for example, cedar oil).

Moreover as the liquid LQ, a liquid with a refractive index of about 1.6 to 1.8 may be used. Furthermore, the optical element LS1 may be formed from a quartz and/or a material with a higher refractive index than that of quartz (for example, above 1.6).

In the abovementioned embodiments, respective position information for the mask stage 3 and the substrate stage 4 is measured using an interference system (3L, 4L). However the invention is not limited to this and for example, an encoder system which detects a scale (grating) provided in each stage may be used. In this case, preferably a hybrid system is furnished with both of an interference system and an encoder system, and calibration of the measurement results of the encoder system is performed using the measurement results of the interference system. Moreover, position control of the stage may be performed using the interference system and the encoder system interchangeably, or using both.

It is to be noted that as for substrate P of each of the above-described embodiments, not only a semiconductor wafer for manufacturing a semiconductor device, but also a glass substrate for a display device, a ceramic wafer for a thin film magnetic head, or a master mask or reticle (synthetic quartz or silicon wafer), etc. can be used.

As for exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Moreover, as for the exposure apparatus EX, the present invention can be applied to an exposure apparatus of a method in which a reduced image of a first pattern is exposed in a batch on the substrate P by using the projection optical system (for example, a refractive projection optical system having, for example, a reduction magnification of ⅛, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. As the stitch type exposure apparatus, a step-and-stitch type exposure apparatus in which at least two patterns are transferred onto the substrate P in a partially overlapping manner, and the substrate P is sequentially moved can be used.

Moreover, in the above embodiments, an exposure apparatus furnished with a projection optical system PL was described as an example. However, the present invention can also be applied to an exposure apparatus and an exposure method which do not use a projection optical system PL. Even in the case where a projection optical system is not used, the exposure light can be irradiated onto the substrate via optical members such as a mask and lens, and an immersion region can be formed in a predetermined space between these optical elements and the substrate.

Furthermore, the present invention can also be applied to a multi stage type exposure apparatus furnished with a plurality of substrate stages, as disclosed for example in Japanese Patent Application, Publication No. H10-163099 A, Japanese Patent Application, Publication No. H10-214783 A (corresponding to U.S. Pat. No. 6,590,634), Published Japanese Translation No. 2000-505958 of PCT International Application (corresponding to U.S. Pat. No. 5,969,411), and U.S. Pat. No. 6,208,407.

Moreover, the present invention can also be applied to an exposure apparatus furnished with a substrate stage for holding a substrate, and a measurement stage on which is mounted a reference member formed with a reference mark, and/or various photoelectronic sensors, as disclosed for example in Japanese Patent Application, Publication No. H11-135400 A (corresponding to PCT International Patent Publication No. WO 1999/23692), and Japanese Patent Application, Publication No. 2000-164504 A (corresponding to U.S. Pat. No. 6,897,963).

Furthermore, in the above embodiments, an exposure apparatus in which the liquid is locally filled in the space between the projection optical system PL and the substrate P is used. However, the present invention can be also applied to a liquid immersion exposure apparatus in which exposure is performed in a condition with the whole surface of the target exposure substrate immersed in a liquid, as disclosed in Japanese Patent Application, Publication No. H06-124873 A, Japanese Patent Application, Publication No. H10-303144 A, and U.S. Pat. No. 5,825,043.

The types of exposure apparatuses EX are not limited to exposure apparatuses for semiconductor element manufacture that expose a semiconductor element pattern onto a substrate P, but are also widely applicable to exposure apparatuses for the manufacture of liquid crystal display elements and for the manufacture of displays, and exposure apparatuses for the manufacture of thin film magnetic heads, image pickup devices (CCDs), micro machines, MEMS, DNA chips, and reticles or masks.

In the abovementioned embodiments, an optical transmission type mask formed with a predetermined shielding pattern (or phase pattern or dimming pattern) on an optical transmission substrate is used. However, instead of this mask, for example as disclosed in U.S. Pat. No. 6,778,257, an electronic mask (called a variable form mask; for example this includes a DMD (Digital Micro-mirror Device) as one type of non-radiative type image display apparatus (space light modulator)) for forming a transmission pattern or reflection pattern, or a light emitting pattern, based on electronic data of a pattern to be exposed may be used.

Furthermore the present invention can also be applied to an exposure apparatus (lithography system) which exposes a line-and-space pattern on a substrate P by forming interference fringes on the substrate P, as disclosed for example in PCT International Patent Publication No. WO 2001/035168.

Moreover, the present invention can also be applied to an exposure apparatus as disclosed for example in Published Japanese Translation No. 2004-519850 of PCT International Application (corresponding U.S. Pat. No. 6,611,316), which combines patterns of two masks on a substrate via a projection optical system, and double exposes a single shot region on the substrate at substantially the same time, using a single scan exposure light.

As far as is permitted by the law of the countries specified or selected in this patent application, the disclosures in all of the Publications and U.S. patents related to exposure apparatuses and the like cited in the above respective embodiments and modified examples, are incorporated herein by reference.

As described above, the exposure apparatus EX of the embodiments of this application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 12:
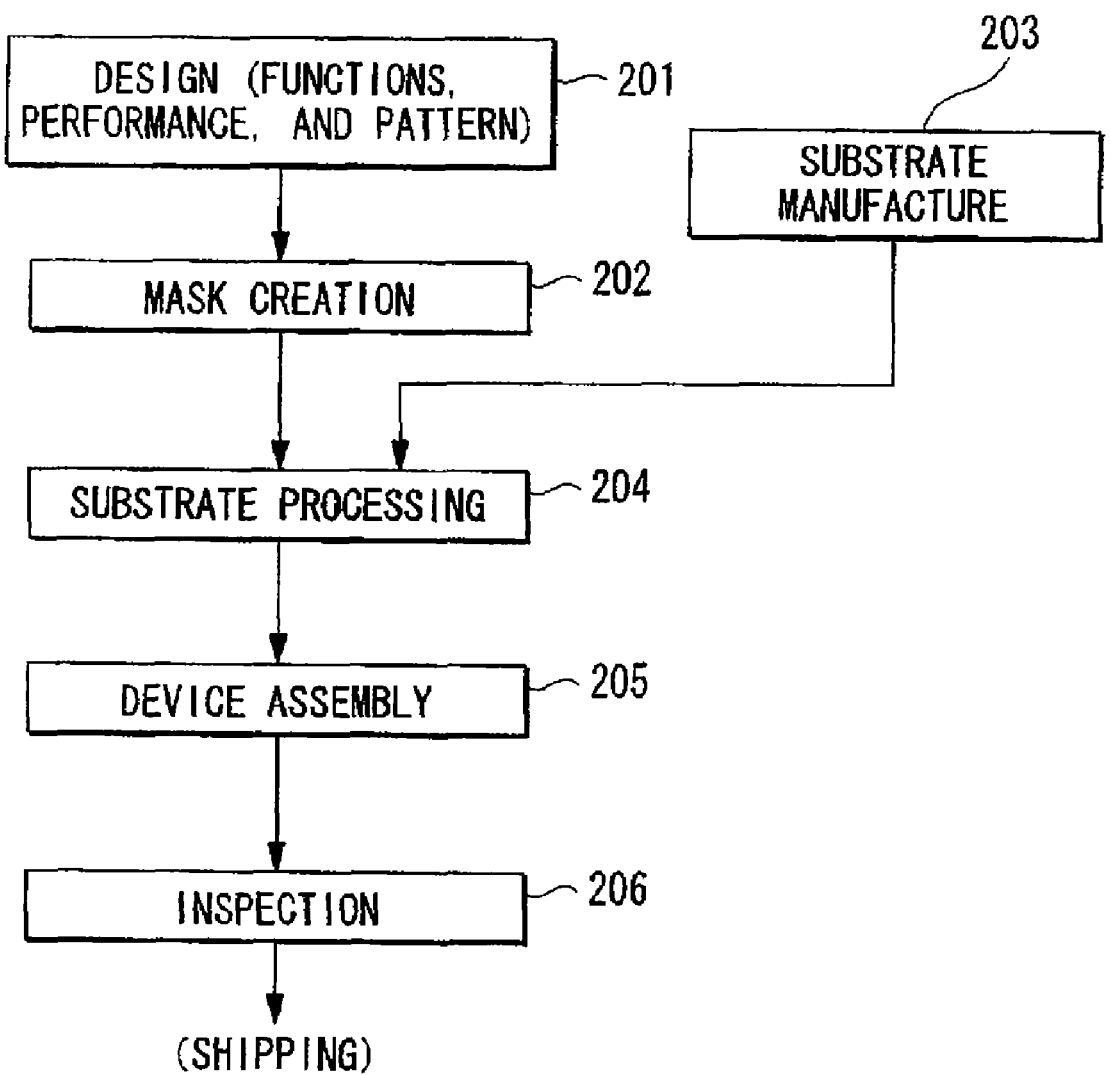
FIG. 12 is a flow chart for showing one example of manufacturing steps for a micro device.

As shown in FIG. 12, microdevices such as semiconductor devices are manufactured by going through: a step 201 that performs microdevice function and performance design, a step 202 that creates the mask (reticle) based on this design step, a step 203 that manufactures the substrate that is the device base material, a step 204 including substrate processing steps such as a process that exposes the pattern on the mask onto a substrate by means of the exposure apparatus EX of the aforementioned embodiments, a process for developing the exposed substrate, and a process for heating (curing) and etching the developed substrate, a device assembly step (including treatment processes such as a dicing process, a bonding process and a packaging process) 205, and an inspection step 206, and so on.

According to the some aspects of the present invention, the occurrence of defective exposure can be suppressed, the pattern can be formed with good accuracy, and devices with predetermined performance can be manufactured. Therefore, the present invention will contribute to the development of high-tech industry and IT technology including the semiconductor industry in Japan.

What is claimed is:

1. An exposure apparatus that exposes a substrate, comprising:
   a supply port through which a first liquid is supplied to an optical path space of exposure light; and
   a supply passage in which the first liquid flows and which is in fluid communication with the supply port, the supply passage having a property of being permeable to a predetermined gas;
   an outer member which surrounds the supply passage, a second liquid being supplied to a space between the supply passage and the outer member, and
   degasifying apparatus which degasifies the second liquid, wherein an amount of a predetermined substance mixed into the first liquid in the supply passage is set to be not greater than a predetermined value.

2. The exposure apparatus according to claim 1, wherein the predetermined substance comprises an eluted substance that is eluted into the first liquid from a member constituting the supply passage.

3. The exposure apparatus according to claim 1, wherein the predetermined substance comprises at least one of metal, boron and anion.

4. The exposure apparatus according to claim 3, wherein an amount of the metal mixed into the first liquid is set to be not greater than 1 ppt.

5. The exposure apparatus according to claim 3, wherein an amount of the boron mixed into the first liquid is set to be not greater than 5 ppt.

6. The exposure apparatus according to claim 3, wherein an amount of the anion mixed into the first liquid is set to be not greater than 5 ppt.

7. The exposure apparatus according to claim 1, wherein the predetermined substance comprises a gas component.

8. The exposure apparatus according to claim 7, wherein an amount of the gas component mixed into the liquid is set to be not greater than 10 ppb.

9. The exposure apparatus according to claim 1, wherein a member that forms the supply passage comprises a fluoroplastic material.

10. The exposure apparatus according to claim 1, wherein a member that forms the supply passage comprises a titanium material.

11. The exposure apparatus according to claim 1, further comprising:
    an optical member that has a bottom surface which contacts the first liquid disposed between the optical member and the substrate, wherein
    the optical path space is positioned between the bottom surface of the optical member and the surface of the substrate.

12. The exposure apparatus according to claim 1, wherein a degasifying for the second liquid is adjustable independently of a degasifying for the first liquid flowing in the supply passage.

13. The exposure apparatus according to claim 1, further comprising:
    a temperature adjuster that adjusts a temperature of the second liquid in the space,
    wherein a temperature of the second liquid is adjustable independently of a temperature of the first liquid flowing in the supply passage.

14. The exposure apparatus according to claim 1, wherein the predetermined gas includes one of oxygen, nitrogen, and air.

15. The exposure apparatus according to claim 1, further comprising:
    a nozzle member which has the supply port and supplies the first liquid to the optical path space,
    wherein the supply port of the nozzle member is provided such that the supply port faces the optical path space.

16. The exposure apparatus according to claim 15, wherein the nozzle member has a recovery port which recovers a liquid in the optical path space, and
    wherein the recovery port faces a surface of the substrate when the substrate is exposed.

17. An exposure apparatus that exposes a substrate, comprising:
    a supply port through which a first liquid is supplied to an optical path space of exposure light;
    a supply passage in which the first liquid flows and which is in fluid communication with the supply port;
    a first member through which a first gas is capable of passing and which forms the supply passage; and
    a prevention apparatus that prevents deterioration of the first liquid by the first gas that has passed through the first member,
    wherein the prevention apparatus reduces an amount of the first gas in an ambient space partitioned by the first member and a second member, the ambient space surrounding the first member and being filled with a fluid, and wherein the fluid is degasified.

18. The exposure apparatus according to claim 17, wherein the prevention apparatus comprises a fluid supply apparatus that supplies the fluid to the ambient space.

19. The exposure apparatus according to claim 17, wherein the fluid is a second liquid which is supplied by the prevention apparatus.

20. The exposure apparatus according to claim 19, wherein the second liquid is degasified.

21. The exposure apparatus according to claim 17, wherein the fluid is a gas.

22. The exposure apparatus according to claim 21, wherein the gas comprises nitrogen.

23. The exposure apparatus according to claim 17, wherein the prevention apparatus comprises a temperature adjuster that adjusts a temperature of the fluid in the ambient space, and adjusts a temperature of the first liquid flowing through the supply passage by means of the temperature-adjusted fluid via the first member.

24. The exposure apparatus according to claim 23, wherein the temperature of the fluid is adjustable independently of a temperature of the first liquid flowing in the supply passage.

25. The exposure apparatus according to claim 17, further comprising
wherein the second member that surrounds the first member, and wherein
the prevention apparatus supplies the fluid to a space between the first member and the second member.

26. The exposure apparatus according to claim 17, wherein the first member is formed of a fluoroplastic.

27. The exposure apparatus according to claim 26, wherein the first gas comprises oxygen.

28. The exposure apparatus according to claim 17, wherein a degasifying for the fluid is adjustable independently of a degasifying for the first liquid flowing in the supply passage.

29. The exposure apparatus according to claim 17, wherein the first gas includes one of oxygen, nitrogen, and air.

30. The exposure apparatus according to claim 17, further comprising:
a nozzle member which has the supply port and supplies the first liquid to the optical path space,
wherein the supply port of the nozzle member is provided such that the supply port faces the optical path space.

31. The exposure apparatus according to claim 30, wherein the nozzle member has a recovery port which recovers a liquid in the optical path space, and
wherein the recovery port faces a surface of the substrate when the substrate is exposed.

32. An exposure method that exposes a substrate, comprising:
flowing a first liquid in a supply passage which has a property of being permeable to a predetermined gas;
supplying the first liquid to an optical path space of exposure light from a supply port via the supply passage; and
supplying a second liquid in an ambient space divided by the supply passage and an outer member,
wherein an amount of a predetermined substance mixed into the first liquid in the supply passage is set to be not greater than a predetermined value, and wherein the second liquid is degasified.

33. The exposure method according to claim 32, wherein the predetermined substance comprises a substance that is eluted into the first liquid from a member constituting the supply passage.

34. The exposure method according to claim 33, wherein the predetermined substance comprises at least one of metal, boron and anion.

35. The exposure method according to claim 34, wherein an amount of the metal mixed into the first liquid is set to be not greater than 1 ppt.

36. The exposure method according to claim 34, wherein an amount of the boron mixed into the first liquid is set to be not greater than 5 ppt.

37. The exposure method according to claim 34, wherein an amount of the anion mixed into the first liquid is set to be not greater than 5 ppt.

38. The exposure method according to claim 33, wherein the predetermined substance comprises a gas component.

39. The exposure method according to claim 38, wherein an amount of the gas component mixed into the first liquid is set to be not greater than 10 ppb.

40. The exposure method according to claim 32, wherein deterioration of the first liquid by a gas that is capable of permeating through a member forming the supply passage is prevented.

41. A device manufacturing method using the exposure method according to claim 32.

42. The exposure method according to claim 32, wherein a degasifying for the second liquid is adjustable independently of a degasifying for the first liquid flowing in the supply passage.

43. The exposure method according to claim 32, wherein a temperature of the second liquid is adjustable independently of a temperature of the first liquid flowing in the supply passage.

* * * * *